United States Patent
Yamazaki et al.

(10) Patent No.: US 6,885,059 B2
(45) Date of Patent: Apr. 26, 2005

(54) NONVOLATILE MEMORY AND SEMICONDUCTOR DEVICE

(75) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 10/725,535

(22) Filed: Dec. 3, 2003

(65) Prior Publication Data

US 2004/0108543 A1 Jun. 10, 2004

Related U.S. Application Data

(62) Division of application No. 09/908,804, filed on Jul. 20, 2001, now Pat. No. 6,724,037.

(30) Foreign Application Priority Data

Jul. 21, 2000 (JP) .......................... 2000-221436

(51) Int. Cl.⁷ ............................. H01L 29/788
(52) U.S. Cl. ................. 257/316; 257/314; 257/315
(58) Field of Search .................. 257/314, 315, 257/316, 317, 318, 319, 320, 321, 322, 323, 324, 325, 326

(56) References Cited

U.S. PATENT DOCUMENTS

| | | | |
|---|---|---|---|
| 4,233,526 A | | 11/1980 | Kurogi et al. |
| 5,198,996 A | * | 3/1993 | Kojima et al. |
| 5,629,548 A | | 5/1997 | Tamaki et al. |
| 5,841,693 A | | 11/1998 | Tsukiji |
| 6,111,296 A | | 8/2000 | Yamazaki et al. |

(Continued)

FOREIGN PATENT DOCUMENTS

| | | |
|---|---|---|
| JP | 10-065162 A | 3/1998 |
| JP | 11-040815 A | 2/1999 |
| JP | 11-054754 A | 2/1999 |
| JP | 11-150198 | 6/1999 |
| JP | 11-163171 A | 6/1999 |
| JP | 11-163171 | 6/1999 |
| JP | 11-163172 A | 6/1999 |
| JP | 11-163172 | 6/1999 |
| JP | 11-233789 A | 8/1999 |

OTHER PUBLICATIONS

U.S. patent application No. 09/192,745 (relates to Japanese Patent Laid-Open Nos. 11-163171 and 11-163172).
U.S. patent application No. 09/129,669 (relates to Japanese Patent Laid-Open No. 11-054754).
U.S. patent application No. 09/115,094 (relates to Japanese Patent Laid-Open No. 11-040815).
U.S. Ser. No. 09/192,745; Filed Nov. 16, 1998; Shunpei Yamazaki; "Nonvolatile Memory and Electronic Apparatus".

*Primary Examiner*—Nathan J. Flynn
*Assistant Examiner*—Kevin Quinto
(74) *Attorney, Agent, or Firm*—Nixon Peabody LLP; Jeffrey L. Costellia

(57) ABSTRACT

A nonvolatile memory transistor with multi values being capable of suppressing a short channel effect is provided. In an active region of a memory transistor, stripe-shaped impurity regions (pinning regions) are formed in a channel length direction. The pinning regions suppress the spread of a depletion layer of a drain region, and a short channel effect caused by fine processing. Furthermore, in a memory transistor using pinning regions, by assigning one value or one bit of data to each channel forming region, the memory transistor is allowed to have multi values. More specifically, the present invention has a configuration in which a floating gate electrode is provided on each of a plurality of channel forming regions via a first gate insulating film, and an electric potential can be applied independently to a plurality of pinning regions.

33 Claims, 14 Drawing Sheets

U.S. PATENT DOCUMENTS

| | | |
|---|---|---|
| 6,127,702 A | 10/2000 | Yamazaki et al. |
| 6,184,556 B1 | 2/2001 | Yamazaki et al. |
| 6,198,141 B1 | 3/2001 | Yamazaki et al. |
| 6,218,714 B1 | 4/2001 | Yamazaki |
| 6,232,642 B1 | 5/2001 | Yamazaki |
| 6,307,220 B1 | 10/2001 | Yamazaki |
| 6,433,372 B1 * | 8/2002 | Adler et al. |
| 6,486,014 B1 | 11/2002 | Miyanaga et al. |
| 6,686,623 B1 | 2/2004 | Yamazaki |
| 6,693,299 B1 | 2/2004 | Yamazaki et al. |

* cited by examiner

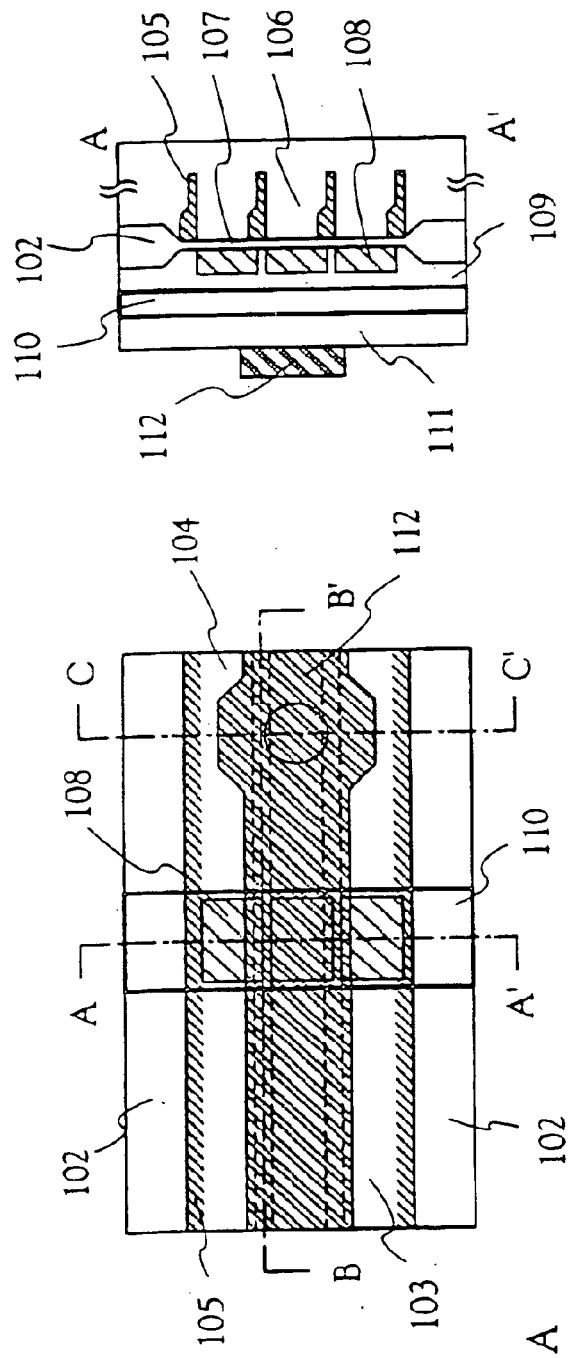
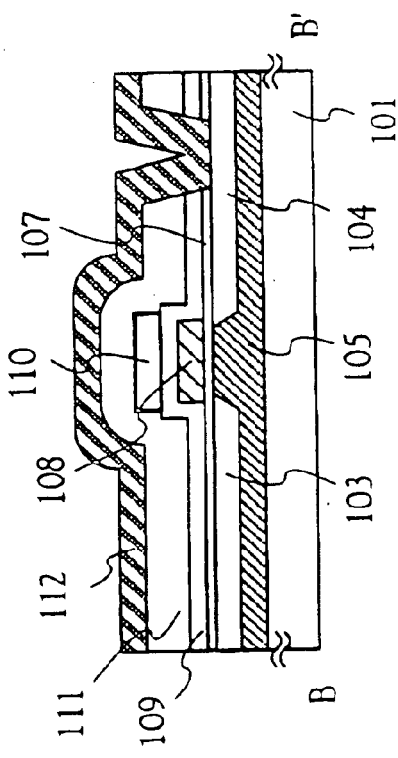
FIG. 1A
FIG. 1B
FIG. 1C

NONVOLATILE MEMORY AND SEMICONDUCTOR DEVICE

This application is a Divisional of Ser. No. 09/908,804 filed on Jul. 20, 2001, now U.S. Pat. No. 6,724,037.

BACKGROUND OF THE INVENTION

1. Field of the Invention

The present invention relates to a nonvolatile semiconductor memory. In particular, the present invention relates to an electrically erasable and programmable read only memory (hereinafter, referred to as an "EEPROM"). More specifically, the present invention relates a nonvolatile semiconductor memory using a multi-valued technique. The present invention is effective for a nonvolatile semiconductor memory with a channel length of 0.01 to 1 $\mu$m (preferably, 0.01 to 0.5 $\mu$m). Furthermore, the present invention relates to a semiconductor device having a nonvolatile semiconductor memory.

In this specification, the EEPROM refers to all the electrically erasable and programmable read only memories, and includes, for example, a full-function EEPROM and a flash memory. Furthermore, unless otherwise specified, the terms "nonvolatile memory" and "nonvolatile semiconductor memory" and the term "EEPROM" are used interchangeably. Furthermore, a semiconductor device refers to all the devices that function by utilizing semiconductor characteristics, and include, for example, electro-optical devices such as a microprocessor, a liquid crystal display device and an EL display device, and electronic apparatus provided with a microprocessor or an electro-optical device.

2. Description of the Related Art

The EEPROM is known as a memory such as a nonvolatile semiconductor memory. Since the EEPROM is a nonvolatile memory, unlike other semiconductor memories, i.e., a dynamic random access memory (DRAM) and a static RAM (SRAM), data are not lost even when a power source is turned off. Furthermore, compared with another nonvolatile memory, i.e., a magnetic disk, the EEPROM has excellent features in terms of an integration density, shock resistance, power consumption, a write/read speed, and the like. Because of these features, there is a tendency that the EEPROM is used as an alternative to various memories such as a magnetic disk and a DRAM.

In particular, the integration density of the EEPROM is being remarkably enhanced. More specifically, the integration density thereof is being increased at a very high pace (i.e., about twice per year). It is expected that the mass-production of the EEPROM with a gigabit capacity will be realized in the near future. Accordingly, the EEPROM will overtake the DRAM in terms of an integration density. Examples of a technique for such enhancement of an integration density include improvement of a circuit configuration, a fine processing technique, and a multi-valued technique.

Regarding the circuit configuration, a full-function EEPROM with a structure of 2 transistors/cell has been improved to a flash memory with a structure of 1 transistor/cell. Furthermore, a NOR-type flash memory requiring a cell area of 10 $F^2$ (F is a minimum processing size) has been improved to a NAND-type flash memory realizing a cell area of 5 $F^2$.

The fine processing technique is the most important technique for promoting a high integration density, miniaturization, and a low cost in substantially all the semiconductors such as an IC, an LSI, a VLSI, and a ULSI. In the EEPROM, a fine processing technique is always introduced in the same way as in the other ICs and the like, and is being developed in accordance with the scaling law.

Furthermore, as a method for enhancing the integration density of a memory, a multi-valued technique is recently being paid attention to. The multi-valued technique refers to a technique for retaining data with three or more values per memory cell. Conventionally, a method for controlling a charge accumulation amount of a floating gate to distinguish three or more states from each other has been developed. A flash memory with four values have already been produced.

As described above, in the EEPROM, remarkable enhancement of an integration density has been achieved by the circuit configuration, the fine processing technique, and the multi-valued technique. In order to further enhance an integration density, it is considered that the fine processing technique and the multi-valued technique are becoming more and more important. However, there are a number of problems in the fine processing technique and the multi-valued technique.

Regarding the fine processing, a scaling limit of the EEPROM is considered to be 0.12 to 0.15 $\mu$m. There are some factors that determine the scaling limit. Examples thereof include a fine processing limit, a short channel effect, and reliability of a tunnel oxide film. Particularly, in an EEPROM requiring an operating voltage higher than that of an ordinary transistor, the short channel effect is a serious problem, and even though fine processing is possible, the EEPROM may not function as a memory due to the short channel effect.

The short channel effect collectively refers to various phenomena that occur in the case where the channel length of a transistor is shortened. Examples of the phenomena include a punchthrough phenomenon, degradation of sub-threshold characteristics (increase in an S value), and a decrease in a threshold voltage. The short channel effect is mostly caused by a depletion layer region spreading from a drain region. Thus, it is a problem how to suppress the spread of a depletion layer region.

Furthermore, regarding the multi-valued technique, in the case of using a conventional method for controlling a charge accumulation amount of a floating gate electrode, it is considered to be difficult to realize the control of variation in a charge accumulation amount, satisfactory charge retention characteristics, and satisfactory read characteristics. Although a flash memory with four values has been realized by the conventional method, in order to further enhance the multi-valued technique, the development of a multi-valued technique different from the conventional method is considered to be required.

SUMMARY OF THE INVENTION

The present invention has been made in view of the above, and it is an object of the present invention to effectively suppress a short channel effect that occurs due to fine processing, and to allow a cell to have multi values by a method completely different from a multi-valued technique according to a conventional method for controlling a charge accumulation amount of a floating gate electrode. It is another object of the present invention to provide a nonvolatile memory with a very high integration density.

According to the present invention, in order to suppress a short channel effect caused by fine processing, a plurality of local impurity regions are formed in an active region of a memory transistor. More specifically, impurity regions are formed in a stripe shape in a channel length direction. Impurities having conductivity reverse to that of the impurities used for source and drain regions are used for the impurity regions provided in a stripe shape.

In this specification, a region surrounded by a source region, a drain region, and an element isolation region is referred to as an "active region", and the active region is further separated into impurity regions provided in a stripe shape and channel forming regions.

The present invention is intended to be applied to a fine nonvolatile memory. More specifically, the present invention is effective for a nonvolatile semiconductor memory having a channel length of 0.01 to 1 μm (preferably, 0.01 to 0.5 μm), a width of an impurity region of 0.01 to 1 μm (preferably, 0.01 to 0.5 μm), and a width of a channel forming region of 0.01 to 1 μm (preferably, 0.01 to 0.5 μm).

In a fine transistor, a procedure for providing local impurity regions in an active region is disclosed in Japanese Patent Application Laid-open No. Hei 10-65162. In this publication, it is described that by providing local impurity regions in an active region, the spread of a depletion layer from a drain region can be suppressed, and a short channel effect can be suppressed while a high ON current is maintained.

In the above-mentioned publication, since the effect of suppressing a depletion layer is taken as if the depletion layer was pinned, the term "pinning" is defined as "suppression". Furthermore, an impurity region for pinning a depletion layer is referred to as a "pinning region".

According to the present invention, as a more important point, a multi-valued memory transistor is realized by utilizing a memory transistor using a pinning region. According to the present invention, considering that a transistor configuration using pinning regions has a plurality of channel forming regions, a memory transistor with multi values is realized by assigning one value or one bit of data to each channel forming region.

In this specification, in the case of distinguishing a memory transistor having pinning regions from a conventional memory transistor, the memory transistor using pinning regions is particularly referred to as a "pinning memory transistor". The pinning memory transistor may be merely referred to as a memory transistor if it is apparent.

The pinning memory transistor of the present invention is characterized in that a floating gate electrode is provided on each of a plurality of channel forming regions via a first gate insulating film, and an electric potential is applied independently to a plurality of pinning regions. Because of this configuration, one value or one bit of data can be stored in each floating gate electrode (each channel forming region).

Hereinafter, a method for operating the pinning memory transistor will be briefly described. Write and erasure of multi-valued data is conducted by using a tunneling current between a floating gate electrode and a pinning region. In the case where a memory transistor is of an n-channel type, electrons are injected to a selected floating gate electrode and discharged from all of the floating gate electrodes. Furthermore, in the case where a memory transistor is of a p-channel type, electrons are discharged from a selected floating gate electrode and injected to all of the floating gate electrodes.

A read method can be classified into the case where one value of data is assigned to each floating gate electrode (referred to as a "1 value/FG method), and the case where one bit of data is assigned (1 bit/FG method). According to the 1 value/FG method, an appropriate electric potential is applied to a control gate electrode, whereby a current value in proportion to the number of formed channels is read. In the case where there are k (k is an integer of 1 or more) floating gate electrodes, (k+1) value of data can be stored in one memory transistor. On the other hand, according to the 1 bit/FG method, during read, an appropriate electric potential is applied to a control gate electrode, while an appropriate potential difference is applied between two pinning regions interposing a channel forming region to be selected and another pinning region. Consequently, a current value reflecting the state of a floating gate electrode to be selected can be read, and one bit of information can be stored per floating gate electrode.

The 1 bit/FG method uses characteristic in which in the case where a voltage is applied to pinning regions interposing a channel forming region, a threshold voltage of a selected channel forming region is shifted. This characteristic is effective when a channel width is very small, and it is desirable that a width of a channel forming region is 0.01 to 1 μm (preferably, 0.01 to 0.5 μm).

The structure of the present invention will be described below.

There is provided a nonvolatile memory comprising a memory transistor which includes a source region, a drain region and an active region that are formed of a single crystal semiconductor, characterized in that the active region is composed of a plurality of impurity regions provided in a stripe shape in a channel length direction and a plurality of intrinsic or substantially intrinsic channel forming regions interposed between the plurality of impurity regions, and the memory transistor stores triple or more-valued data.

There is provided a nonvolatile memory comprising a memory transistor which includes a source region, a drain region and an active region that are formed of a single crystal semiconductor and in which a first gate insulating film, a plurality of floating gate electrodes, a second gate insulating film, and a control gate electrode are stacked (laminated) over the active region, characterized in that the active region is composed of a plurality of impurity regions provided in a stripe shape in a channel length direction and a plurality of intrinsic or substantially intrinsic channel forming regions interposed between the plurality of impurity regions, the plurality of floating gate electrodes are provided over the plurality of channel forming regions in one-to-one correspondence via the first gate insulating film, the control gate electrode is provided so as to be overlapped with the plurality of floating gate electrodes via the second gate insulating film, and the memory transistor stores triple or more-valued data.

There is provided a nonvolatile memory comprising a memory transistor which includes a source region, a drain region and an active region formed of a single crystal semiconductor and in which a first gate insulating film, a plurality of floating gate electrodes, a second gate insulating film, and a control gate electrode are stacked over the active region, characterized in that the active region is composed of a plurality of impurity regions provided in a stripe shape in a channel length direction and a plurality of intrinsic or substantially intrinsic channel forming regions interposed between the plurality of impurity regions, the plurality of floating gate electrodes are provided over the plurality of channel forming regions in one-to-one correspondence via the first gate insulating film, the control gate electrode is provided so as to be overlapped with the plurality of floating gate electrodes via the second gate insulating film, electric potentials of the plurality of impurity regions are independently controlled, and the memory transistor stores triple or more-valued data.

Each of the plurality of floating gate electrodes may be partially overlapped with one of the plurality of impurity regions via the first gate insulating film.

The plurality of impurity regions provided in the active region may be formed continuously even in one or both of the source region and the drain region.

It is preferable that the plurality of impurity regions are made of an element selected from Group 13 or Group 15 of the Periodic Table.

It is preferable that the plurality of impurity regions are made of an element selected from Group 13 or Group 15 of the Periodic Table, and suppress a depletion layer spreading from the drain region to the source region.

It is preferable that a concentration of an element contained in the plurality of impurity regions is $1 \times 10^{17}$ to $5 \times 10^{20}$ atoms/cm$^3$.

It is preferable that a channel length of the memory transistor is 0.01 to 1 µm.

It is preferable that a width of the plurality of impurity regions is 0.01 to 1 µm.

It is preferable that a width of the plurality of channel forming regions is 0.01 to 1 µm.

A semiconductor device utilizing the nonvolatile memory as a recording medium is provided.

A microprocessor is provided as the semiconductor device.

A display, a video camera, a goggle type display, a DVD player, a head mount display, a personal computer, a mobile phone, and a car audio system are provided as the semiconductor device.

BRIEF DESCRIPTION OF THE DRAWINGS

FIGS. 1A to 1C show an entire configuration of a nonvolatile memory of the present invention;

DESCRIPTION OF THE PREFERRED EMBODIMENTS

In this embodiment mode, first, a typical device configuration of a pinning memory transistor of the present invention will be described. Thereafter, various effects (suppression of a short channel effect, etc.) by pinning regions and how to allow the pinning memory transistor to have multi values will be described.

Figure 2:
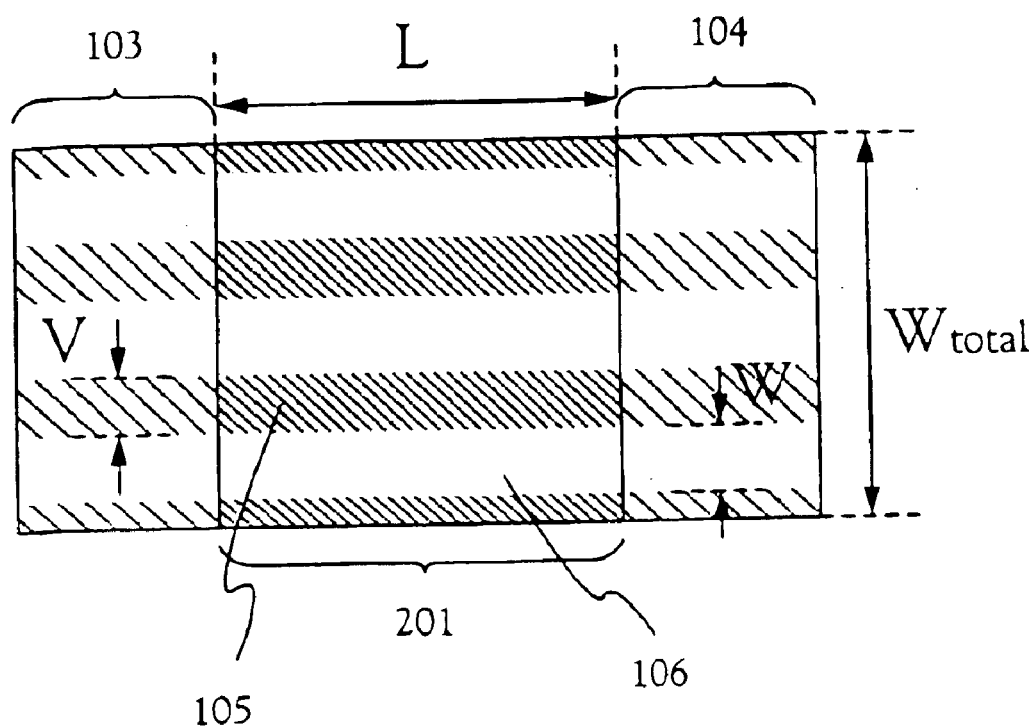
FIG. 2 is a top view illustrating a partial configuration of the nonvolatile memory of the present invention.

First, referring to FIGS. 1A to 1C and 2, a typical device configuration of a pinning memory transistor of the present invention will be described. FIG. 1A is a top view of a pinning memory transistor with a stack structure, and FIGS. 1B and 1C are cross-sectional views thereof. Furthermore, FIG. 2 shows a part of the top view shown in FIGS. 1A to 1C, illustrating a source region, a drain region, and an active region.

Referring to FIGS. 1A to 1C, reference numeral 101 denotes a single crystal silicon substrate, and 102 denotes a field oxide film formed by a LOCOS method. It is appreciated that an STI method or another element isolation method may be used. Reference numerals 103 and 104 respectively denote a source region and a drain region. In these regions, an element selected from Group 15 of the Periodic Table (typically, arsenic or phosphorus) in the case where a memory transistor is of an n-channel type, and an element selected from Group 13 of the Periodic Table (typically, boron, gallium, or indium) in the case where a memory transistor is of a p-channel type are added in a high concentration. Furthermore, reference numerals 105 and 106 denote a pinning region and a channel forming region, respectively.

The pinning region 105 is an impurity region of conductivity reverse to that of the source region 103 and the drain region 104. That is, in the case of n-channel type memory transistor, the pinning region is formed by adding an element selected from Group 13 of the Periodic Table (typically, boron, gallium, or indium). In particular, indium that is less dispersed is preferable. Furthermore, in the case of a p-channel memory transistor, the pinning region is formed by adding an element selected from Group 15 of the Periodic Table (typically, arsenic or phosphorus). In particular, arsenic that is less dispersed is preferable. According to the present invention, the concentration of these impurity elements is adjusted in a range of $1 \times 10^{17}$ to $5 \times 10^{20}$ atoms/cm$^3$ (preferably $1 \times 10^{16}$ to $5 \times 10^{19}$ atoms/cm$^3$).

It is desirable that the implantation depth of the pinning region 105 is at least larger than an injunction depth of the source region 103 and the drain region 104 (see FIG. 1C). The implantation depth of the pinning region 105 may be adjusted in a range of 0.05 to 0.5 µm (preferably 0.2 to 0.3 µm).

In order to describe the pinning region 105 and the channel forming region 106 that are key points of the present invention in more detail, FIG. 2 will be referred to. The regions corresponding to those in FIGS. 1A to 1C are denoted with the same reference numerals as those therein. Reference numeral 201 denotes a region interposed between the source region and the drain region, and in this specification, the region 201 is referred to as an active region.

Herein, some terms will be defined. First, the distance (corresponding to the length of the active region 201) between the source region 103 and the drain region 104, the width of the pinning region 105, and the width of the channel forming region 106 are defined as a channel length (L), a pinning width (v), and a channel width (w), respectively. Furthermore, the width of the active region 201 is defined as a total channel width ($W_{total}$). The total channel width equals to a sum of the total pinning width and the total channel width. A direction along a channel length is referred to as a channel length direction, and a direction vertical to a channel length direction are referred to as a channel width direction.

As shown in FIG. 2, one pinning region 105 is typically formed in a line shape in the channel length direction. A plurality of pinning regions 105 are provided in a stripe shape. At this time, two pinning regions positioned on both sides are preferably formed so as to include side end portions (end portions where the active region 201 is in contact with the field oxide film 102) of the active region 201. The channel forming region 106 is defined as a region surrounded by the source region 103, the drain region 104, and the pinning region 105 (or the field oxide film 102). The active region 201 is composed of the pinning regions 105 and the channel forming regions 106.

In the multi-valued memory transistor of the present invention, one value or one bit of data is assigned to one channel forming region, so that at least two channel forming regions 106 are required. Furthermore, there is an advantage that by providing pinning regions 105 at side ends (end portions where the active region 201 is in contact with the field oxide film 102) of the active region 201, a leakage current flowing through the side ends can be reduced.

Furthermore, as shown in FIG. 2, the pinning regions are formed in the source region 103 and the drain region 104, as well as the active region 201. The reason for this is that in the multi-valued nonvolatile memory of the present invention, lines are required to be led out from the individual pinning regions 105. According to the present invention, the pinning regions traverse the source region 103 or the drain region 104, whereby lines are led out from the individual pinning regions 105. However, as long as an electric potential is applied to the individual pinning regions 105, any configuration can be used.

Figure 3:
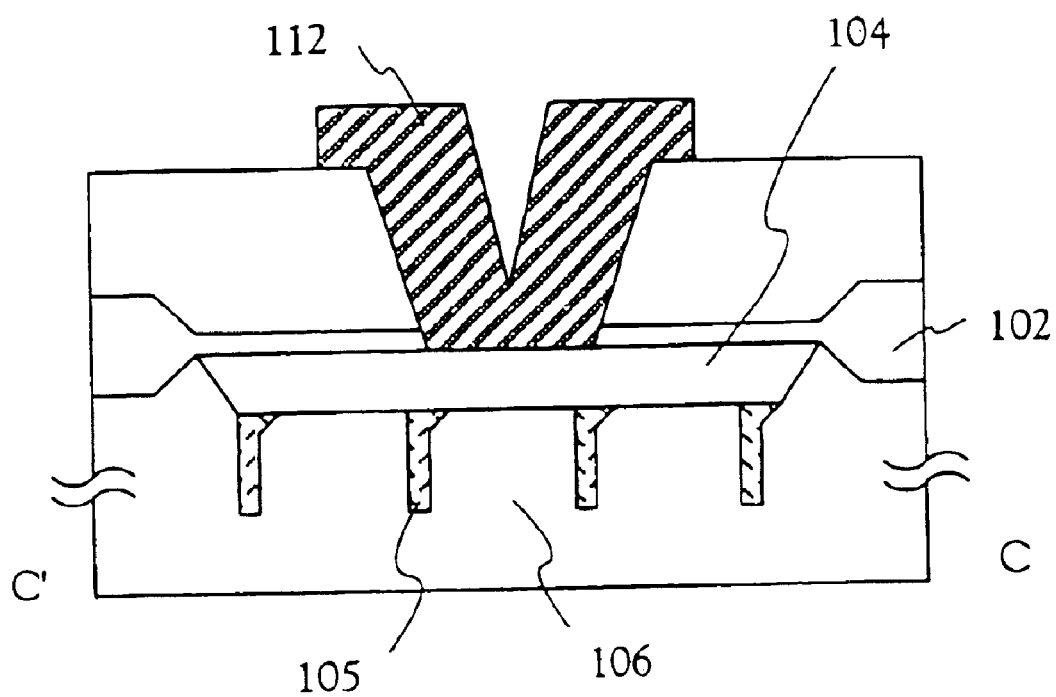
FIG. 3 is a cross-sectional view illustrating a partial configuration of the nonvolatile memory of the present invention.

FIG. 3 shows an example of a cross-sectional configuration of a drain region in which pinning regions are formed. FIG. 3 is a cross-sectional view taken along a line C–C' of the memory transistor shown in FIG. 1A. The regions corresponding to those in FIGS. 1A to 1C are denoted with the same reference numerals as those therein. In FIG. 3, the impurity concentration of the drain region 104 is prescribed to be higher than that of the pinning regions 105. Furthermore, the injunction depth of the drain region 104 is prescribed to be smaller than that of the pinning regions 105. Because of this configuration, the pinning regions 105 can traverse the drain region 104 so that the drain region 104 is not separated by the pinning regions 105. The same configuration can also be used even in the case where the pinning regions 105 traverse the source regions 103.

Referring to FIGS. 1A to 1C again, a device configuration of the memory transistor will be described.

In FIGS. 1A to 1C, a first gate insulating film 107, floating gate electrodes 108, a second gate insulating film 109, a control gate electrode 110, an interlayer film 111, and a line 112 are successively stacked (laminated) on the above-mentioned active region.

One floating gate electrode 108 is stacked over each channel forming region 106 via the first gate insulating film 107. Furthermore, the control gate electrode 110 is shared by all the floating gate electrodes 108, and stacked over the floating gate electrodes 108 via the second gate insulating film 109. That is, one memory transistor incorporates a plurality of memory transistors that share the source region 103, the drain region 104, and the control gate electrode 110. In this specification, a memory transistor incorporated in parallel with the pinning memory transistor of the present invention is referred to as a "sub-memory transistor".

The individual floating gate electrodes 108 are also partially overlapped with the pinning regions 105 via the first gate insulating film 107. Furthermore, two or more floating gate electrodes are not simultaneously overlapped with one pinning region. A region where the floating gate electrode is overlapped with the pinning region is referred to as an "overlap region".

It is desirable that the thickness of the first gate insulating film 107 is set to be 6 to 20 nm. Furthermore, the floating gate electrodes 108 and the control gate electrode 110 are preferably made of a polycrystalline silicon layer. A conductive layer such as a metal film may also be used in place of the polycrystalline silicon layer. It is also effective to use a stacked film (called an ONO film) represented by $SiO_2$/$SiN$/$SiO_2$ as the interlayer film 111.

The pinning memory transistor shown in FIGS. 1A to 1C has a configuration having three floating gate electrodes, in other words, three sub-memory transistors. However, the present invention is not limited thereto. In general, the pinning memory transistor may have a configuration having k (k is an integer of 1 or more) floating gate electrodes (or sub-memory transistors).

The nonvolatile memory of the present invention mainly has two outstanding features by using a memory transistor with the above-mentioned device configuration. One of the features is that a memory transistor can have multi values, which is very effective for a high integration density of a nonvolatile memory. The other is that the performance in a memory transistor as well as a transistor is enhanced. In particular, the effect of suppressing a short channel effect is indispensable for promoting fine processing, and is very important for a high integration density of a nonvolatile memory.

Thus, the present invention is effective for a memory transistor with a very small size. More specifically, the present invention is effective in the case where a channel length (L) is 0.01 to 1 µm (preferably, 0.01 to 0.5 µm). A pinning width may be 0.01 to 1 µm (preferably, 0.01 to 0.3 µm). Furthermore, any channel width may be used; however, according to the present invention, it is not particularly required to allow a large current to flow, so that the channel width may be 0.01 to 1 µm (preferably, 0.01 to 0.5 µm).

Figure 4A:
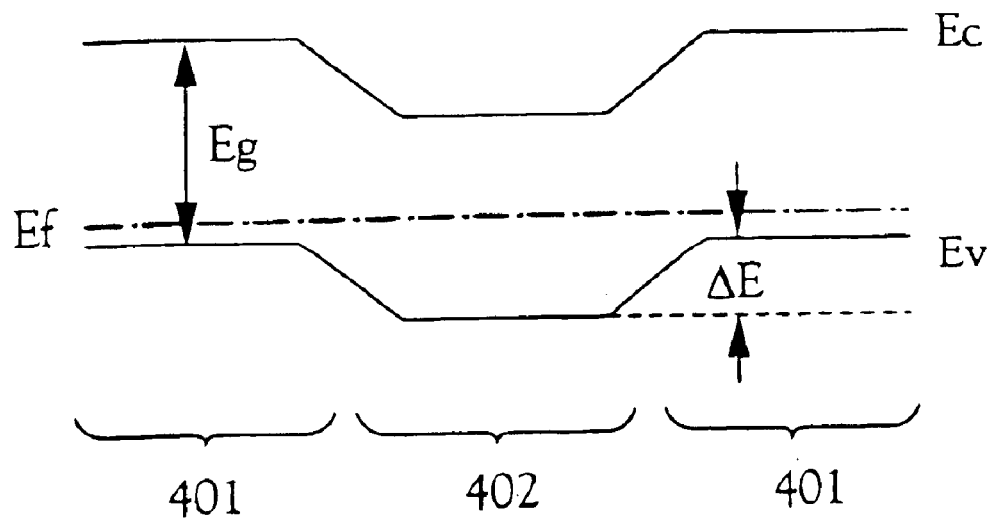
FIGS. 4A and 4B illustrate changes in an energy band.
Figure 4B:
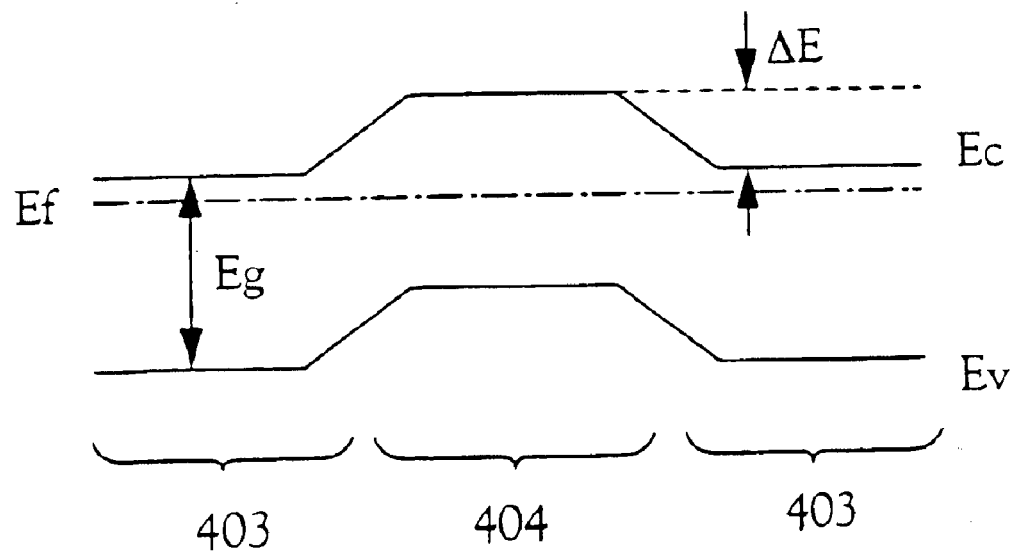

Before describing the effect of the pinning regions, an energy band of the active region including the pinning regions will be studied. FIGS. 4A and 4B schematically show energy band diagrams, respectively, in a channel width direction of an active region in n-channel and p-channel type pinning memory transistors. In FIGS. 4A and 4B, reference numerals 401 and 403 denote pinning regions, and reference numerals 402 and 404 denote channel forming regions.

First, the channel forming regions 402 and 404 are intrinsic or substantially intrinsic. Therefore, a Fermi level Ef is positioned nearly at the center of an energy gap Eg.

An intrinsic region refers to a region where impurity elements providing an N-type or a P-type and impurity elements such as carbon, nitrogen, and oxygen are not added intentionally. For example, when an I-type silicon substrate (intrinsic silicon substrate) is produced by a high-level refining technique and used, an intrinsic channel forming region is obtained. Furthermore, a substantially intrinsic region basically refers to an undoped single crystal semiconductor region. In addition, the substantially intrinsic region includes a region in which conductivity is intentionally canceled by adding an impurity element of reverse conductivity, and a region having one conductivity in a range where a threshold voltage can be controlled. For example, single crystal silicon having a dopant concentration of $5 \times 10^{16}$ atoms/cm$^3$ or less (preferably $5 \times 10^{15}$ atoms/cm$^3$ or less), and containing carbon, nitrogen, and oxygen in a concentration of $2 \times 10^{18}$ atoms/cm$^3$ or less (preferably, $5 \times 10^{17}$ atoms/cm$^3$ or less) can be considered to be substantially intrinsic. In this sense, a silicon wafer generally used for an IC is substantially intrinsic as long as impurities are not intentionally added during a process.

On the other hand, the pinning regions 401 and 403 are made of an element selected from Group 13 of the Periodic Table in the case of an n-channel type memory transistor, and they are made of an element selected from Group 15 of the Periodic Table in the case of a p-channel type memory transistor. An element selected from Group 13 of the Periodic Table provides an acceptor level of electrons, and an element selected from Group 15 of the Periodic Table provides a donor level of electrons. Therefore, in the n-channel type memory transistor, an energy band of the pinning region 401 is shifted to a conduction band side, and in the p-channel type memory transistor, an energy band of the pinning region 403 is shifted to a valence band side. Consequently, schematic diagrams of energy bands as shown in FIGS. 4A and 4B are obtained.

As is understood from FIGS. 4A and 4B, in both the cases of an n-channel type and a p-channel type, the pinning region forms an energy barrier with respect to majority carriers (electrons in the n-channel type; holes in the p-channel type). In contrast, the pinning region forms a region that is stable in terms of energy with respect to minority carriers (holes in the case of the n-channel type; electrons in the case of the p-channel type). The height $\Delta E$ of an energy barrier changes by the concentration of an added impurity element. According to the present invention, the concentration of the impurity element is adjusted in a range of $1 \times 10^{17}$ to $5 \times 10^{20}$ atoms/cm$^3$ (preferably, $1 \times 10^{18}$ to $5 \times 10^{19}$ atoms/cm$^3$).

Since the pinning region forms an energy barrier with respect to majority carriers, the majority carriers preferentially move in the respective channel forming regions. As a result, in the case where stripe-shaped pinning regions are provided from the source region to the drain region, movement paths of the majority carriers are defined by the pinning regions. In a multi-valued memory transistor, one value or one bit of data is assigned to a plurality of movement paths.

As the effect of the pinning region, the effect as a transistor of a memory transistor will be briefly described. A procedure for providing pinning regions in a transistor is disclosed by Japanese Patent Application Laid-open No. Hei 10-65162, so that this publication can be referred to for more information.

First, the pinning region functions as a stopper with respect to a depletion layer spreading from a drain side, thereby effectively suppressing the spread of the depletion layer. Thus, punchthrough phenomenon caused by the spread of the depletion layer can be prevented. Furthermore, an increase in a depletion layer charge caused by the spread of the depletion layer can be suppressed, so that subthreshold characteristics are enhanced, and a decrease in a threshold voltage can be avoided.

Second, by narrowing a channel width, a threshold voltage can be increased. As described above, the pinning region forms an energy barrier with respect to majority carriers. When a channel width is narrowed, intrusion of the energy barrier into a channel forming region cannot be negligible, and a threshold voltage is increased. This is a phenomenon known as one of narrow channel effects. The narrow channel effect becomes conspicuous when the channel width becomes smaller.

As described above, according to the present invention, by suppressing a short channel effect and freely designing the concentration of impurities to be added to pinning regions and a channel width, the level of the narrow channel effect is controlled, and a threshold voltage can be adjusted.

Third, according to the present invention, there is an advantage that a channel forming region is composed of a substantially intrinsic region. Since the region where carriers move is substantially intrinsic, a decrease in mobility caused by scattering of impurities becomes very small, and a high carrier mobility can be obtained. Consequently, in a non-volatile memory of the present invention, particularly, a read time is substantially shortened.

Fourth, the pinning region plays a role in preventing conduction of a parasitic bipolar caused by impact ionization. The reason for this is that the pinning region forms a region which is stable in terms of energy with respect to minority carriers, and minority carriers generated by impact ionization immediately move to the pinning region to be pulled out to a line. Therefore, unlike the prior art, a parasitic bipolar is not brought into conduction by the change in an electric potential of a substrate, and the withstand voltage between a source and a drain is not decreased.

As described above, by forming the pinning regions, various outstanding effects such as suppression of a short channel effect can be obtained.

Next, a multi-valued pinning memory transistor, which is a key point of the present invention, will be described. The memory transistor of the present invention is a multi-valued memory transistor utilizing a plurality of channel forming regions formed by pinning regions.
The above-mentioned multi-valued memory transistor is characterized in that an electric potential is independently applied by leading lines out of individual pinning regions, and each floating gate electrode forms a region (overlap region) where the floating gate electrode is partially overlapped with the pinning region via a first gate insulating film (see FIGS. 1A–1C).

Figure 5:
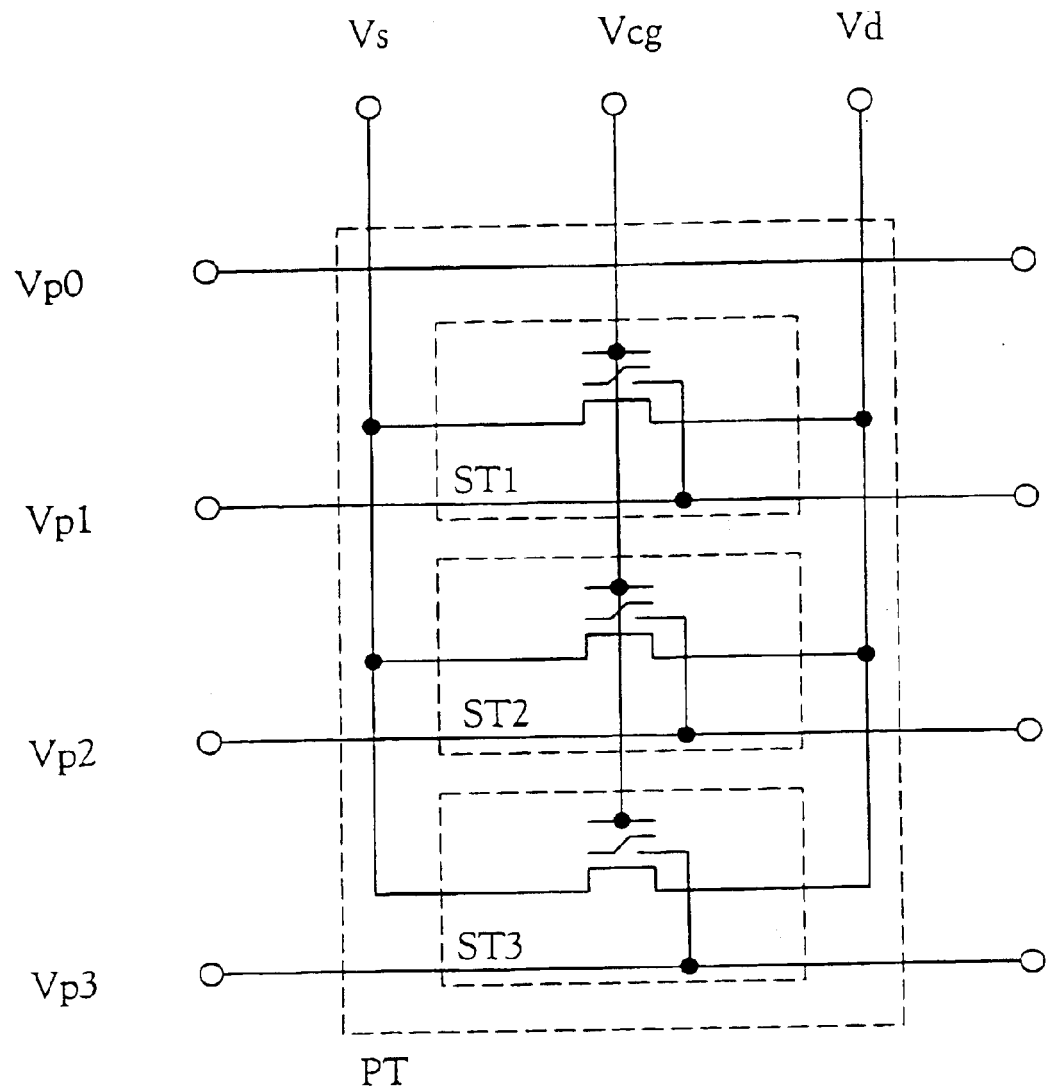
FIG. 5 is a view showing an equivalent circuit of the nonvolatile memory of the present invention.

Thus, the pinning memory transistor shown in FIGS. 1A to 1C can be represented by an equivalent circuit as shown in FIG. 5. In FIG. 5, PT denotes a pinning memory transistor, and ST1, ST2 and ST3 denote sub-memory transistors. $V_d$ denotes a drain voltage, $V_s$ denotes a source voltage, $V_{cg}$ denotes a control gate voltage, and $V_{p0}$, $V_{p1}$, $V_{p2}$ and $V_{p3}$ denote electric potentials in the pinning regions (hereinafter, referred to as "pinning potentials").

The pinning memory transistor shown in FIG. 5 is composed to three sub-memory transistors. However, the present invention is not limited thereto. In general, the pinning memory transistor may have k (k is an integer of 1 or more) sub-memory transistors.

Referring to FIG. 5, a method for operating a multi-valued memory transistor of the present invention will be described. In the multi-value memory transistor of the present invention, write/erasure of data is conducted with a tunneling current. Furthermore, as a read method, a method for assigning one value to one floating gate electrode (1 value/

FG method) and a method for assigning one bit to one floating gate electrode (1 bit/FG method) will be described. The 1 bit/FG method is advantageous in an integration density. On the other hand, the 1 value/FG method is excellent in a read margin and reliability.

In the multi-valued memory transistor of the present invention, injection/discharge of electrons with respect to the floating gate electrodes is conducted with a tunneling current. In the case where a memory transistor is of an n-channel type, electrons are injected to individual floating gates, and electrons are discharged simultaneously from the floating gate electrodes constituting one memory transistor. More specifically, injection of electrons is conducted by applying a potential difference between a control gate electrode and a pinning region partially overlapped with a selected floating gate electrode, and discharge of electrons is conducted by applying an electric potential between a control gate electrode and one or a plurality of pinning regions. During discharge of electrons, a p-type inversion layer is formed in a channel forming region, so that electrons are discharged from all the floating gate electrodes.

Furthermore, in the case where a memory transistor is of a p-channel type, electrons are discharged from individual floating gates, and electrons are injected to all the floating gate electrodes. That is, discharge of electrons is conducted by applying a potential difference between a control gate electrode and a pinning region partially overlapped with a selected floating gate electrode, and injection of electrons is conducted by applying an electric potential between a control gate electrode and one or a plurality of pinning regions. During discharge of electrons, an n-type inversion layer is formed in a channel forming region, so that electrons are injected to all the floating gate electrodes.

As a read method, a method for assigning one value of data to each floating gate electrode (1 value/FG method) and a method for assigning one bit of data (1 bit/FG method) will be described. According to the 1 value/FG method, an appropriate electric potential is applied to a control gate electrode during reading. Consequently, a channel is formed in a channel forming region, depending upon an accumulation state of charge of the floating gate electrode, and a current amount in proportion to the number of formed channels is read. According to the 1 value/FG method, (k+1) value of data can be stored with respect to k (k is an integer of 1 or more) floating gate electrodes.

According to the 1 bit/FG method, it is required to apply an appropriate potential to a control gate electrode. Simultaneously, it is also required to apply an appropriate potential difference between two pinning regions interposing a channel forming region to be selected and another pinning region. This read method utilizes the effect similar to a change in a threshold voltage seen in a narrow channel effect, and takes advantage of characteristics in that when a voltage is applied between two pinning regions interposing a channel forming region, a threshold voltage of the channel forming region is shifted. For example, in the case of an n-channel type memory transistor, a negative voltage is applied to a pinning region other than two pinning regions interposing a channel forming region to be selected. In the case of a p-channel type memory transistor, a positive voltage is applied to a pinning region other than two pinning regions interposing a channel forming region to be selected. Consequently, the control gate electrode can be supplied with a voltage so that all the channel forming regions which are not selected are turned off, and the channel forming region to be selected is turned on/off, reflecting a charge accumulation state of a floating gate electrode. Thus, one bit of information can be stored per floating gate electrode.

According to the 1 bit/FG method, it is particularly required that a channel width is small. The width of a channel forming region is desirably 0.01 to 1 μm (preferably, 0.01 μm to 0.5 μm).

Based on the equivalent circuit shown in FIG. 5, exemplary operating voltages of the n-channel type and p-channel type multi-valued memory transistors of the present invention are summarized in Tables 1 and 2. Tables 1 and 2 show operating voltages of a pinning memory transistor having three floating gate electrodes corresponding to the equivalent circuit shown in FIG. 5. However, in general, a similar operation may be conducted even in the case where k (k is an integer of 1 or more) floating gate electrodes are provided. Needless to say, the operating voltages shown in Tables 1 and 2 are exemplary, and it is not required that the operating voltage is limited to the values in Tables 1 and 2.

TABLE 1

| | $V_d$ | $V_{cg}$ | $V_s$ | $V_{p0}$ | $V_{p1}$ | $V_{p2}$ | $V_{p3}$ | Target for operation |
|---|---|---|---|---|---|---|---|---|
| Write | 0 | 6 | 0 | 0 | −6 | 0 | 0 | ST1 |
| | 0 | 6 | 0 | 0 | 0 | −6 | 0 | ST2 |
| | 0 | 6 | 0 | 0 | 0 | 0 | −6 | ST3 |
| Erasure | 6 | −6 | 6 | 6 | 6 | 6 | 6 | PT |
| Read 1 value/ FG method | 1 | 5 | 0 | 0 | 0 | 0 | 0 | PT |
| Read 1 bit/ FG method | 1 | 5 | 0 | 0 | −1 | −5 | −5 | ST1 |
| | 1 | 5 | 0 | −7 | 0 | 0 | −7 | ST2 |
| | 1 | 5 | 0 | −5 | −5 | −1 | 0 | ST3 |

TABLE 2

| | $V_d$ | $V_{cg}$ | $V_s$ | $V_{p0}$ | $V_{p1}$ | $V_{p2}$ | $V_{p3}$ | Target for operation |
|---|---|---|---|---|---|---|---|---|
| Write | 0 | −6 | 0 | 0 | 6 | 0 | 0 | ST1 |
| | 0 | −6 | 0 | 0 | 0 | 6 | 0 | ST2 |
| | 0 | −6 | 0 | 0 | 0 | 0 | 6 | ST3 |
| Erasure | −6 | 6 | −6 | −6 | −6 | −6 | −6 | PT |
| Read 1 value/ FG method | −1 | 1 | 0 | 0 | 0 | 0 | 0 | PT |
| Read 1 bit/ FG method | −1 | 1 | 0 | 0 | 1 | 6 | 5 | ST1 |
| | −1 | 1 | 0 | 7 | 0 | 0 | 7 | ST2 |
| | −1 | 1 | 0 | 5 | 6 | 1 | 0 | ST3 |

The multi-valued nonvolatile memory of the present invention is applicable to various EEPROMs. The multi-valued nonvolatile memory of the present invention can be applied to both a full-function EEPROM capable of erasing data on a memory device basis, and a flash memory that erases data at a time on a block basis. In the case of application to a flash memory, a circuit configuration of a NOR type, a NAND type, or other known types can be adopted. However, the present invention is different from a conventional circuit configuration in that a line for controlling multi values, called a pinning line, is provided (see Embodiments 3 and 5).

Furthermore, in this embodiment mode, a memory transistor with a stack structure has been described. However, the present invention is also applicable to a memory transistor with a split gate configuration (see Embodiment 2).

Furthermore, the memory transistor of the present invention is also capable of writing with hot electrons. More specifically, by applying a voltage between two pinning regions interposing a channel forming region to be written, impact ionization may be caused only in a selected channel forming region. For example, in the case of an n-channel type, in order to increase a directional electric field in a channel length direction of a drain region, a potential of two pinning regions may be prescribed to be higher than that of another pinning region.

Furthermore, by forming an overlap region between a floating gate electrode and a source region or a drain region, electrons can be injected/discharged by using a tunneling current from a source side or a drain side.

Furthermore, according to the present invention, it is also effective to provide pinning regions with respect to a transistor constituting a driving circuit and other peripheral circuits to be integrated with a memory transistor, or a transistor constituting other circuits to be integrated with a memory portion in a semiconductor device. Because of this, even in a circuit other than a memory cell, suppression of a short channel effect and the effect of other pinning regions can be obtained.

[Embodiment 1]

In this embodiment, a method of manufacturing a nonvolatile memory of the present invention will be described. A pinning memory transistor of the present invention is basically composed of a source region, a drain region, channel forming regions, floating gate electrodes, and a control gate electrode, excluding pinning regions. Therefore, a known manufacturing method can be used as long as fine processing is possible.

Particularly, in the same way as in a conventional method of manufacturing a memory transistor, it is preferable that a first gate insulating film is formed so as to have satisfactory quality by thermal oxidation. Furthermore, it is desirable that a layered film (called an ONO film) represented by $SiO_2/SiN/SiO_2$ is used as an interlayer film. It is appreciated that other insulating films can also be used.

In view of a manufacturing method, the pinning memory transistor of the present invention is characterized in that impurity regions called pinning regions are formed, and a memory transistor with a very small device size is targeted. For example, the pinning region is characterized in that it is partially overlapped with a floating gate electrode via the first gate insulating film, and traverses the source region and the drain region. Furthermore, regarding a device size, the floating gate electrode, the pinning region, and the channel forming region should be formed typically with a size of 0.01 to 1 $\mu$m. An overlap structure between the floating gate electrode and the pinning region is required to have a further fine structure.

In order to manufacture such an ultrafine structure, a self-alignment method is generally effective. Even in the pinning memory transistor of the present invention, it is desirable to use the self-alignment method for forming the pinning regions, the overlap regions, the source region, and the drain region. More specifically, ultrafine processing of floating gate electrodes is conducted, and pinning regions are formed with self-alignment method by ion implantation method, using the floating gate electrodes as a mask. Particularly, in the case where an overlap region is formed between the floating gate electrode and the pinning region, impurities may be diagonally (obliquely) implanted by ion implantation method.

According to the ultrafine processing of the floating gate electrodes, regarding a pattern up to about 0.15 $\mu$m, a mask pattern can be formed with a resist by a stepper and a scan light-exposure apparatus. On the other hand, when a pattern size becomes 0.15 $\mu$m or less, it is required to form a mask pattern by electron drawing. After the mask pattern is formed, it is preferable to conduct dry etching by ICP or the like.

Impurities may be implanted to the pinning regions by high energy implantation in a direction vertical to a substrate and low energy implantation in a direction diagonally to the substrate. Alternatively, impurities may be implanted at a time under a high energy in a direction diagonally to the substrate.

It is preferable that an impurity element added to the pinning regions is activated by furnace annealing, laser annealing, lamp annealing, or the like. In particular, in order to minimize diffusion of impurities, it is preferable that the impurities are activated by an RTA (rapid thermal annealing) method.

Next, formation of pinning regions in the regions where lines are led out from the source region, the drain region, and the pinning regions will be described. An example of a cross-sectional configuration in the case where the pinning regions traverse the drain region is shown in FIG. 3, and described in the embodiment mode of the present invention. Since the pinning regions have a fine structure, they are preferably manufactured by self-alignment method. Thus, even in the regions other than the active region, such as the source region and the drain region, in which the pinning regions are required to be formed, floating gate electrodes are subjected to fine processing into an appropriate shape. Then, using the floating gate electrodes as a mask, these pinning regions are preferably formed simultaneously with the pinning regions in the active region by ion implantation method.

Finally, the floating gate electrodes other than those in the active region are removed. A resist may be used as a mask, or the control gate electrode may be removed as a mask.

Furthermore, doping of impurities to the source region and the drain region is conducted by self-alignment method, using the control gate electrode as a mask. At this time, the depth of implantation to the source/drain regions is adjusted so as to be smaller than that of the pinning regions. Furthermore, in order to prevent the source/drain regions from being separated by the pinning regions, it is required to set the concentration of impurities in the source/drain regions higher than that of impurities in the pinning regions. Thus, a cross-sectional configuration in FIG. 3 is formed. Setting the depth of implantation to the source/drain regions smaller than that of the pinning regions is also important for the purpose of effectively suppressing the spread of a depletion layer in the drain region.

In the case where the source region and the drain region are separated by the pinning regions, polysilicon containing impurities (typically, phosphorus in the case of an n-type, and boron in the case of a p-type) of the same conductivity as that of the source/drain regions is formed to a film after formation of contact holes, and a metal film made of aluminum or the like is formed, whereby the source region and the drain region can be contacted.

In this embodiment, regarding a method of manufacturing a pinning memory transistor of the present invention, a method of manufacturing pinning regions and ultrafine processing have been particularly described. By appropriately incorporating these processes to a known process of manufacturing a memory transistor, the nonvolatile memory of the present invention can be manufactured. It should be noted that any manufacturing method may be used as long as the configuration of the pinning memory transistor described in this embodiment or the circuit configurations described in Embodiments 3 and 5 are obtained.

[Embodiment 2]

In this embodiment, as an example different from the configuration (see FIGS. 1A to 1C) of the pinning memory transistor described in the embodiment mode, an exemplary configuration of a pinning memory transistor having a split gate structure will be described with reference to FIGS. 6A to 6C.

The regions other than the floating gate electrodes and the control gate electrode have the same configuration as that of the stack gate memory transistor shown in FIGS. 1A to 1C, and the same reference numerals as those in FIGS. 1A to 1C will be used. That is, regarding the elements in FIGS. 6A to 6C denoted with the same reference numerals as those in FIGS. 1A to 1C, the description in FIGS. 1A to 1C should be referred to. In this embodiment, particularly, a floating gate electrode and a control gate electrode will be described.

Figure 6B:
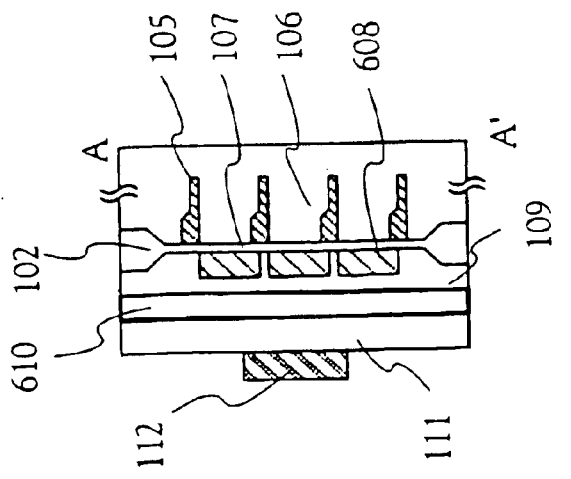
FIGS. 6A to 6C show an entire configuration of the nonvolatile memory of Embodiment 2.
Figure 6A:
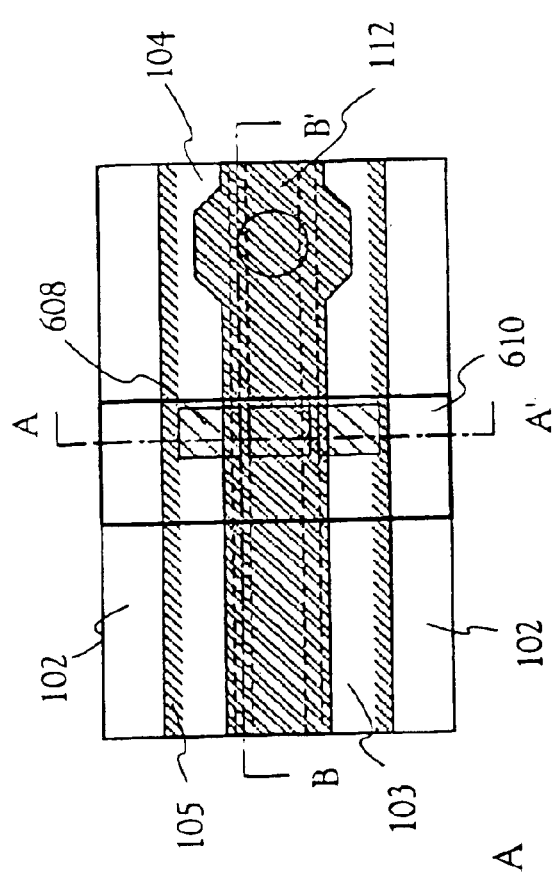
Figure 6C:
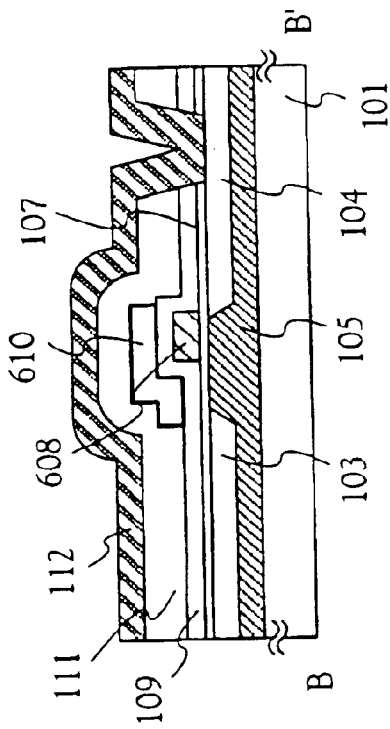

The split gate structure refers to that a part of a control gate electrode 610 is directly stacked on an active region via a first gate insulating film, as shown in FIGS. 6A to 6C. Thus, channel forming regions are separated into those in which floating gate electrodes 608 are formed via the first gate insulating film and those in which the control gate electrode 610 is formed.

Figure 14:
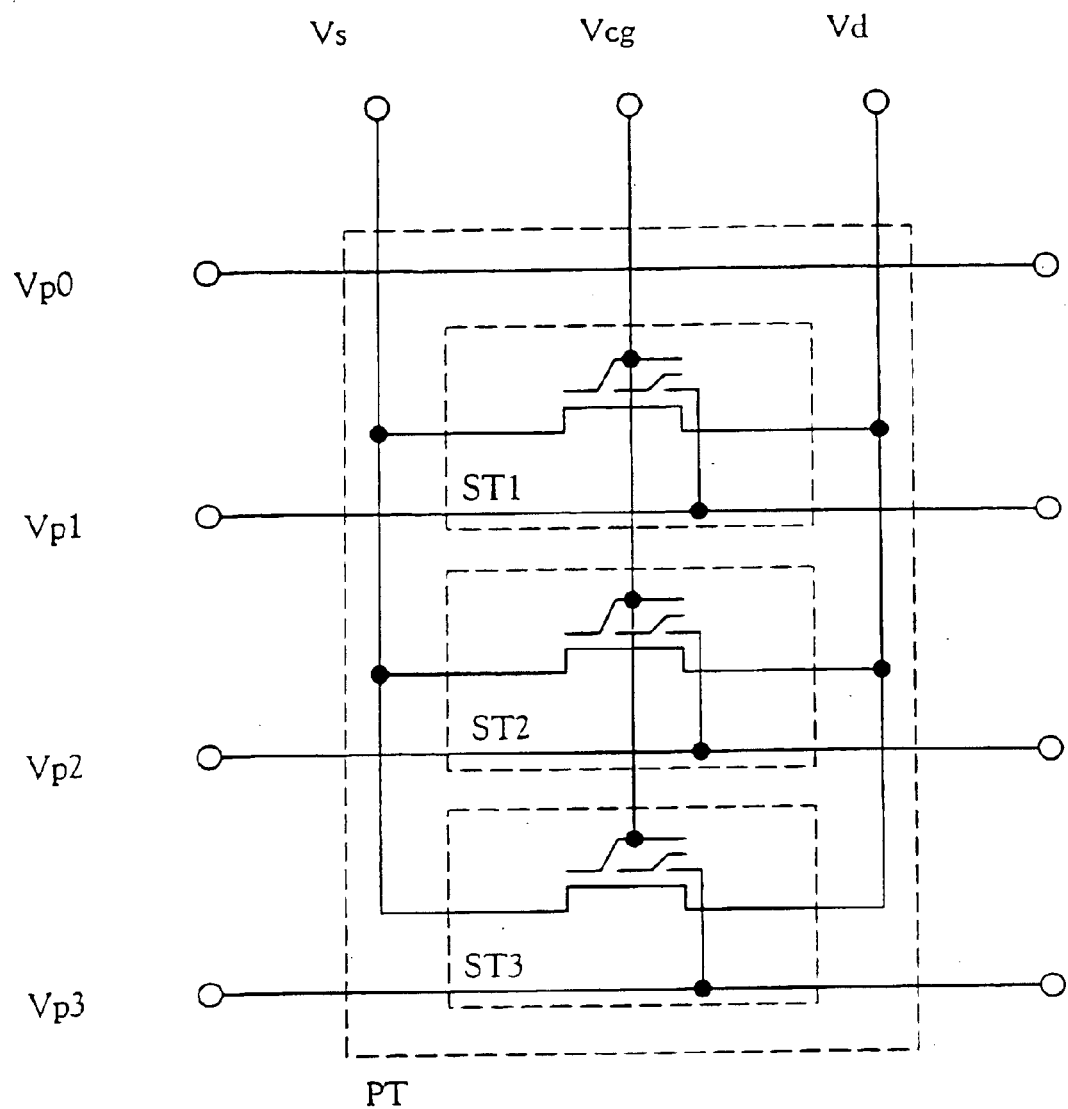
FIG. 14 is a view showing an equivalent circuit of the nonvolatile memory of Embodiment 2.

FIG. 14 shows an equivalent circuit of the pinning memory transistor with a split gate structure shown in FIGS. 6A to 6C. A method for operating the pinning memory transistor with a split gate structure may be the same as that for operating the pinning memory transistor with a stack structure. The advantage of using the split gate structure lies in that a region where the control gate electrode is formed above the channel forming region functions as a selective transistor. That is, this region has functions of increasing selectivity of a pinning memory transistor, and keeping an OFF state even when a cell that is not selected is in an excess erasure state in a case of read.

The pinning memory transistor with a split gate structure can also be manufactured basically by the same steps as those of the pinning memory transistor with a stack structure. That is, the pinning memory transistor with a split gate structure can be manufactured by the process shown in Embodiment 1.

[Embodiment 3]

In this embodiment, a circuit will be described in which a multi-valued memory transistor of the present invention is applied to a NAND-type flash memory. The present invention is different from a conventional NAND-type flash memory in that a line (called a pinning line) for controlling multi values is provided, and hence, write, erasure, and read methods are different, etc.

Figure 7:
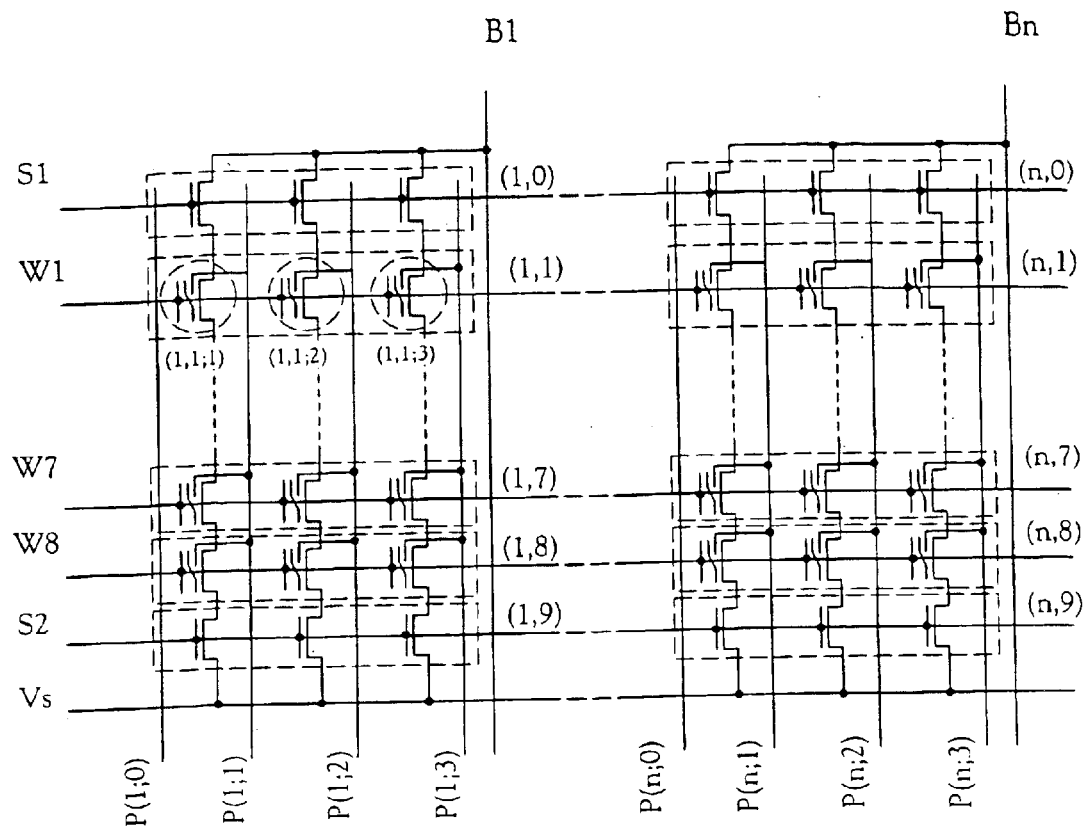
FIG. 7 shows a circuit configuration of the nonvolatile memory of Embodiment 3.

FIG. 7 shows a circuit diagram of a NAND-type memory cell array in which memory cells are arranged in a matrix (8×n (n is an integer of 1 or more)). Each memory cell is composed of one pinning memory transistor surrounded by a broken line in a rectangular shape.

In this embodiment, the case will be described in which each pinning memory transistor has three floating gate electrodes. It is to be understood that this embodiment is applicable even in the case where a pinning memory transistor has k (k is an integer of 1 or more) floating gate electrodes. Furthermore, in this embodiment, a memory cell array (8×n) will be described. However, the present invention is not limited thereto. Memory transistors (1,1) to (n,m) may be transistors of an n-channel or p channel type. In this embodiment, an n-channel type transistor is used.

In FIG. 7, pinning memory transistors arranged in the same column (for example, (1,1) to (1,8) in the first column) are connected in series to each other. Furthermore, pinning memory transistors arranged in the same row (for example, (1,1) to (n,1) in the first row) have their respective control gate electrodes connected to one word line W1.

Connecting pinning memory transistors in series to each other means that sub-memory transistors constituting a pinning memory transistor and pinning regions are connected in series. Furthermore, the control gate electrode of the pinning memory transistor is shared by all the sub-memory transistors constituting the pinning memory transistor.

Selective transistors (1,0) and (1,9) are connected in series to both ends of eight pinning memory transistors (for example, (1,1) to (1,8) in the first column) connected in series. That is, the selective transistors (1,0) to (n,0) are disposed on the memory cells in the first row, and the selective transistors (1,9) to (n,9) are disposed under the memory cells in the eighth row. Bit lines B1 to Bn are connected respectively to the remaining one end of the source electrode and the drain electrode of the selective transistors (1,0) to (n,0), and a selective gate line S1 is connected to the gate electrodes thereof. A common source potential $V_s$ is supplied to the remaining one end of the source electrode and the drain electrode of the selective transistors (1,9) to (n,9), and a selective gate line S2 is connected to the gate electrodes thereof.

Four pinning regions of eight pinning memory transistors (for example, (1,1) to (1,8) in the first column) connected in series are connected respectively to pinning lines P(1;0), P(1;1), P(1;2), and P(1;3).

A method for operating a nonvolatile memory of the present invention thus constructed will be described. According to the present invention, as described in the embodiment, write and erasure are conducted with a tunneling current between the floating gate electrode and the pinning region. As a read method, the 1 value/FG method or 1 bit/FG method can be used. In the case of the 1 value/FG method, the nonvolatile memory of this embodiment can store 4 values (i.e., 2 bits of data) in each memory cell, so that it has a memory capacity of 8×n×2 bits. Furthermore, in the case of the 1 bit/FG method, the nonvolatile memory of this embodiment can store 3 bits in each memory cell, so that it has a memory capacity of 8×n×3 bits. Regarding write and erasure, simultaneous write in one row and batch erasure will be described.

In the conventional NAND-type flash memory, write and erasure are conducted with a tunneling current between the floating gate electrode and the entire surface (well) of channel forming region. According to the present invention, it is not required to control such a well potential. Furthermore, a tunneling current uses an overlap region, so that a coupling ratio can be rendered larger compared with the conventional method using the entire surface of a channel region, and a low operating voltage can be realized.

In this embodiment, a "0" state refers to a state in which charge is accumulated in a floating gate electrode of a memory transistor, and a "1" state refers to a state in which charge is not accumulated in a floating gate electrode of a memory transistor. Furthermore, it is assumed that the threshold voltage of a memory transistor in the "0" state is 0.5 to 3 V, and the threshold voltage of a memory transistor in the "1" state is −1 V or less.

First, simultaneous write in one row will be described. As a specific example, using the pinning memory transistors (1,1) to (n,1) in the first row, the case will be described in which "0" is written in a sub memory transistor (1,1;1) constituting the memory transistor (1,1), "1" is written in the other sub-memory transistors (1,1;2) and (1,1;3), and "1" is written in all the sub-memory transistors constituting memory transistors (2,1) to (n,1). It is assumed that all the sub-memory transistors are in a "1" state before writing data.

First, it is assumed that the pinning line P (1;1) and the source potential $V_s$ are grounded, and the pinning lines P(1;0), P(1;2), and P(1;3) are at 7 V. Furthermore, the selective gate lines S1 and S2 are respectively supplied with 0 V, and the selective transistors (1,0) to (n,0) and (1,9) to (n,9) are turned off. Then, the word line W1 is supplied with 15 V, word lines W2 to W8 are supplied with 7 V, and bit lines B1 to Bn are supplied with 0 V.

Consequently, in the memory transistor (1,1), a high voltage (about 15 V) is applied only between the floating gate and the pinning region of the sub-memory transistor (1,1;1), and charge is injected to the floating gate due to a tunneling current, whereby "0" is written therein. Only 8 V of a potential difference is caused between the pinning region and the floating gate constituting the sub-memory transistors (1,1;2) and (1,1;3) and the memory transistors (2,1) to (n,1), and hence, charge is not injected to the floating gate. That is, the sub-memory transistors (1,1;2) and (1,1;3), and the memory transistors (2,1) to (n,1) remain in the "1" state. Furthermore, regarding memory transistors in the rows other than the first row, only 7 V of a potential difference is caused between the floating gate and the pinning region, and hence, charge is not injected to the floating gate. Thus, simultaneous write in one row is conducted.

Next, read from the memory transistor (1,1) by the 1 value/FG method will be described. First, the pinning lines P(1;0) to P(1;3) are grounded, and the word line W1 is supplied with 0 V, and the word lines W2 to W8 are supplied with 5 V. Because of this, all the memory transistors in the second to eighth rows are turned on. Furthermore, in the memory transistor in the first row, a sub-memory transistor in the "1" state is turned on, and a sub-memory transistor in the "0" state is turned off. That is, the current amount of eight memory transistors connected in series is determined by the number of sub-memory transistors in the "1" state constituting the memory transistor (1,1) in the first row. Then, the selective gate lines $S_1$ and $S_2$ are supplied with 5 V, the selective transistors are turned on, and the source potential $V_s$ is grounded, whereby four values of data stored in the memory transistor (1,1) can be read out through the bit line B1.

Hereinafter, read from the memory transistor (1,1) by the 1 bit/FG method will be described. First, a method for selectively reading one bit of information from the sub-memory transistor (1,1;1) will be described. The pinning lines P(1;0) and P(1;1) are grounded, the pinning lines P(1;2) and P(1;3) are supplied with −5 V, and the word line W1 is supplied with 0 V. Because of this, in the memory transistor in the first row, all the sub-memory transistors other than the sub-memory transistor (1,1;1) are turned off. Furthermore, the sub-memory transistor (1,1;1) is turned on if it is in the "1" state, and turned off if it is in the "0" state. On the other hand, the word lines W2 to W8 are supplied with 5 V. Because of this, in the memory transistors in the second to eighth rows, all the sub-memory transistors connected in series to the sub-memory transistor (1,1;1) are turned on. Consequently, conduction or non-conduction of eight memory transistors connected in series is determined by the state of the sub-memory transistor (1,1;1). Then, the selective gate lines S1 and S2 are supplied with 5 V, the selective transistors are turned on, and the source potential $V_s$ is grounded, whereby data can be read out from the sub-memory transistor (1,1;1) through the bit line B1. In the same way, one bit of information can be read out from the sub-memory transistors (1,1;2) and (1,1;3), and three bits of information can be read from the memory transistor (1;1).

In the case of conducting batch erasure, all the word lines W1 to W8 are supplied with 0 V, and all the pinning lines P(1;i) to P(n;i) (i=0 to 3) are supplied with 15 V. As a result, a high potential difference is caused between the floating gate electrode and the pinning region, and erasure is conducted due to a tunneling current. The electric potentials of the selective gate lines S1 and S2 are determined so that the selective transistors are turned off.

Needless to say, the above-mentioned value of an operating voltage is exemplary, and the present invention is not limited thereto. Actually, a voltage applied to a memory transistor depends upon the thickness of a semiconductor active layer of a memory transistor, the capacity between the control gate electrode and the floating gate electrode, etc. The operating voltage of the memory transistor is also varied in accordance therewith.

During write and read with respect to a memory transistor, when a voltage is applied to a memory cell in the same column or row, erroneous erasure or erroneous write may be conducted. It is required that an operating voltage is set so as to minimize write stress and read stress, and so as not to cause erroneous erasure and erroneous write.

The circuit configuration of this embodiment can be manufactured by using the process shown in Embodiment 1. In particular, regarding a selective transistor, floating gate electrodes are processed in the same way as in the other sub-memory transistors, pinning regions are formed by self-alignment, and thereafter, the floating gate electrodes may be removed by etching.

[Embodiment 4]

Figure 8:
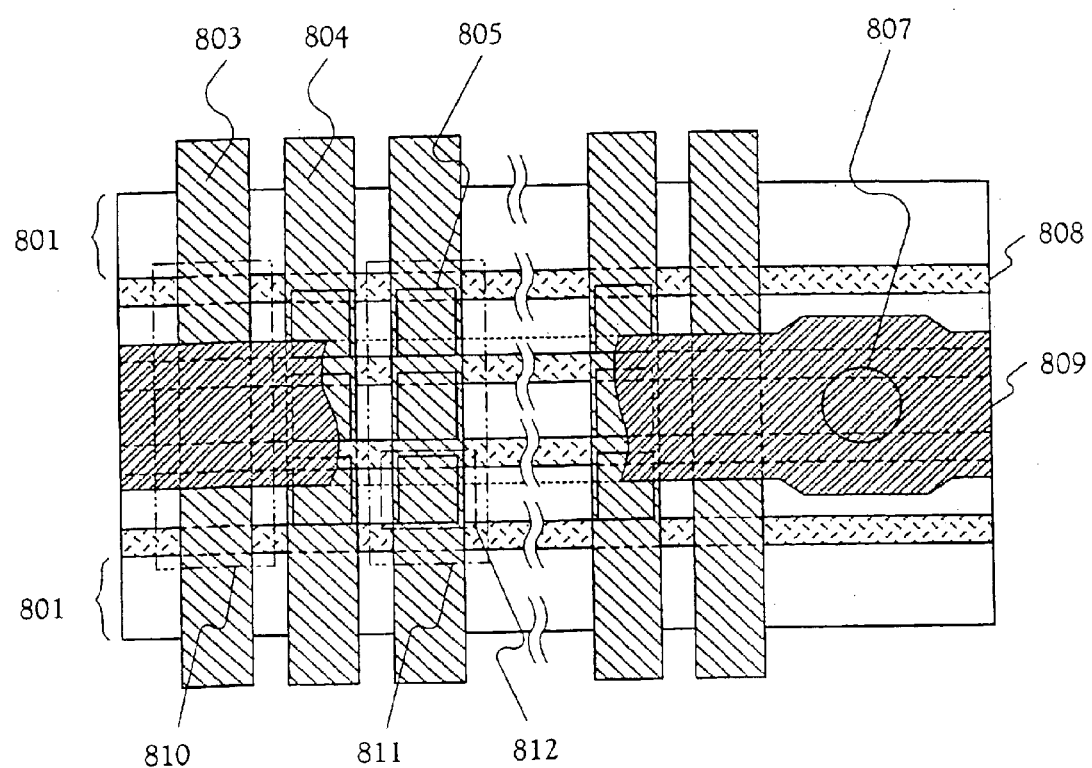
FIG. 8 is a top view of the nonvolatile memory of Embodiment 4.

In this embodiment, an upper surface configuration of a memory cell constituting a nonvolatile memory using pinning regions according to the present invention will be described. FIG. 8 shows an exemplary upper surface of a memory cell array constituting a NAND-type flash memory described in Embodiment 3.

The top view in FIG. 8 shows a memory cell array in which two pinning selective transistors 810 and eight pinning memory transistors 811 (only three transistors 811 are shown) are connected in series. Reference numeral 801 denotes a field oxide film, and 808 denotes a pinning region. In FIG. 8, each pinning memory transistor 811 has three floating gate electrodes 805, and composed of three sub-memory transistors 812. Furthermore, a control gate electrode of the memory transistor 811 also functions as a word line 804, and a gate electrode of the selective transistor 810 also functions as a selective line 803. A drain region of the selective transistor 810 and a line (bit line) 809 are electrically connected to each other via a contact hole 807.

In this embodiment, an exemplary upper surface of the memory cell of the embodiment according to the present invention is illustrated. Needless to say, any upper surface may be used as long as it is matched with the circuit configuration described in Embodiment 3.

[Embodiment 5]

In this embodiment, a circuit will be described in which the multi-valued memory transistor of the present invention is applied to a NOR-type flash memory. The present invention is different from a conventional NOR-type flash memory in that a line (called a pinning line) for controlling multi values is provided, and hence, write, erasure, and read methods are different.

Figure 9:
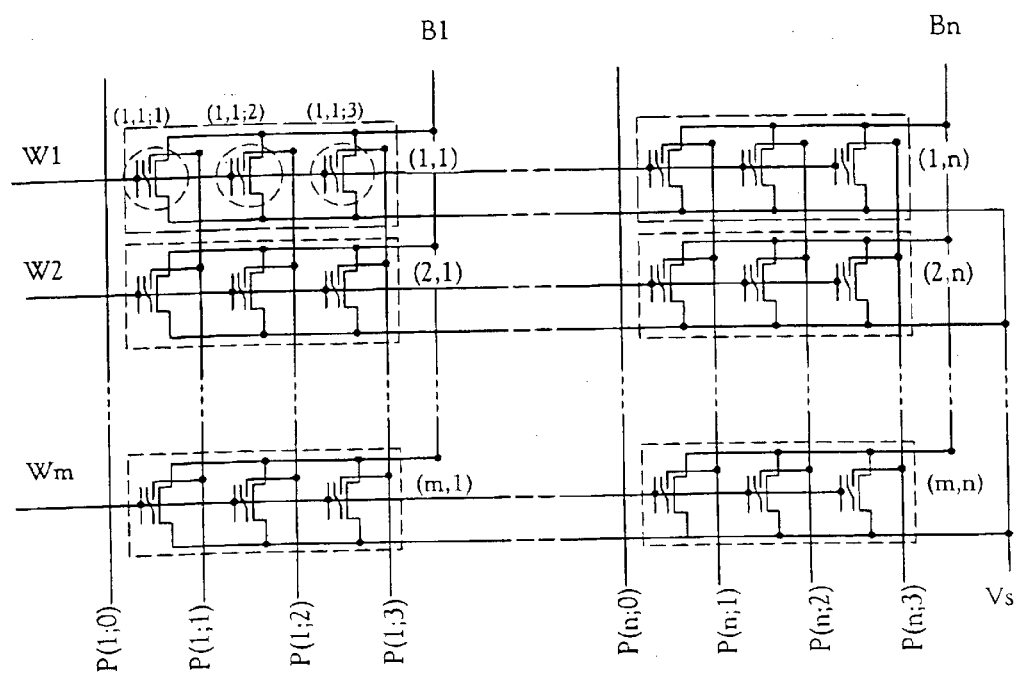
FIG. 9 is a view showing a circuit configuration of the nonvolatile memory of Embodiment 5.

FIG. 9 is a circuit diagram of a NOR-type memory cell array in which memory cells are arranged in an m×n matrix (m and n are integers of 1 or more). Each memory cell is composed of one pinning memory transistor surrounded by a broken line in a rectangular shape.

In this embodiment, the case will be described in which each pinning memory transistor has three floating gate electrodes. However, it is appreciated that this embodiment is applicable even in the case where each pinning memory transistor has k (k is an integer of 1 or more) floating gate electrodes. Furthermore, memory transistors (1,1) to (n,m) may be transistors of an n-channel or p-channel type. In this embodiment, an n-channel type transistor is used.

Referring to FIG. 9, in pinning memory transistors (i,1), (i,2) to (i,m) constituting m memory cells arranged in the i-th column (i is an integer of 1 to n), drain electrodes are connected to a bit line Bi, and source electrodes are supplied with a source potential $V_s$. Furthermore, four pinning regions are respectively connected to pinning lines P(i;0), P(i;1), P(i;2), and P(i;3). Furthermore, in memory transistors (1,j), (2,j) to (n,j) constituting n memory cells arranged in the j-th row (j is an integer of 1 to m), control gate electrodes are connected to a word line Wj.

A method for operating the nonvolatile memory of the present invention thus configured will be described. According to the present invention, as described in the embodiment mode, write and erasure are conducted with a tunneling current between the floating gate electrode and the pinning region. As a read method, the 1 value/FG method or the 1 bit/FG method can be used. In the case of the 1 value/FG method, the nonvolatile memory of this embodiment can store four values, i.e., two bits of data in each memory cell, so that it has a memory capacity of m×n×2 bits. Furthermore, in the case of the 1 bit/FG method, the nonvolatile memory of this embodiment can store 3 bits in each memory cell, so that it has a memory capacity of m×n×3 bits.

In the nonvolatile memory of the present invention, write is conducted with a tunneling current. Therefore, compared with a conventional NOR-type flash memory that conducts injection of hot electrons, a current amount required for writing may be small. This facilitates an increase in pressure, and make it possible to conduct high-speed write by simultaneous write.

As a specific example, write, read, and batch erasure of the entire memory with respect to the pinning memory transistor (1,1) in FIG. 9 will be described.

First, in the case where write is conducted with respect to the sub-memory transistor (1,1;1) constituting the pinning memory transistor (1,1), the source potential $V_s$ and the bit lines B1 to Bn are grounded, a positive voltage (e.g., 6 V) is applied to the word line W1, and a negative voltage (e.g., −6 V) is applied to the pinning line P (1;1). Furthermore, the pinning lines other than the pinning line P(1;1) is supplied with 0 V. Consequently, a high potential difference (about 12 V) is caused only between the floating gate and the pinning region of the sub-memory transistor (1,1;1), and injection of charge (i.e., write) with respect to the floating gate with a tunneling current is conducted. Write to the other sub-memory transistors (1,1;2) and (1,1;3) constituting the pinning memory transistor (1,1) can also be conducted in the same way.

Read from the memory transistor (1,1) by the 1 value/FG method will be described. First, the source potential $V_s$ and the pinning lines P(1;0) to P(1;3) are grounded, and a predetermined potential is applied to the word line W1. As a result, in the memory transistor (1,1), a sub-memory transistor in which charge is not accumulated in a floating gate electrode is turned on, and a sub-memory transistor in which charge is accumulated in a floating gate electrode is turned off. More specifically, the total channel width formed by the memory transistor (1,1) is in proportion to the number of floating gate electrodes in which charge is not accumulated. Thus, four values of data stored in the memory transistor (1,1) is read through the bit line B1.

Read from the memory transistor (1,1) by the 1 bit/FG method will be described. First, a method for selectively reading one bit of information from the sub-memory transistor (1,1;1) will be described. The source potential $V_s$ and the pinning lines P(1;0) and P(1;1) are grounded, the pinning lines P(1;2) and P(1;3) are supplied with −5 V, and a predetermined potential is applied to the word line W1. Consequently, in the memory transistor in the first row, all the sub-memory transistors other than the sub-memory transistor (1,1;1) are turned off. The sub-memory transistor (1,1;1) is turned on if charge is not accumulated in the floating gate electrode, and is turned off if charge is accumulated in the floating gate electrode. Thus, one bit of data stored in the sub-memory transistor (1,1;1) can be read through the bit line B1. In the same way, one bit of information can be read from the sub-memory transistors (1,1;2) and (1,1;3) and three bits of information can be read from the memory transistor (1;1).

A predetermined voltage may be set between the threshold voltage in an erased state (i.e., state in which electrons are not accumulated in a floating gate electrode) and the threshold voltage in a written state (i.e., state in which electrons are accumulated in a floating gate electrode). For example, in the case where a memory transistor in an erased state has a threshold voltage of 0.5 to 3.5 V, and a memory transistor in a written state has a threshold voltage of 6.5 V or more, for example, 5 V can be used as a predetermined voltage.

It is assumed that all the potentials of signal lines B2 to Bn, W2 to Wm, P(2;i) to P(n;i) (i=0 to 3) that are not selected during write and read are 0 V.

In the case where batch erasure is conducted in the entire memory, the source potential $V_s$, the bit lines B1 to Bn, and the word lines W1 to Wm are grounded. When a positive voltage (e.g., 12 V) is applied to the pinning lines P(1;1) to P(n;3), in all the memory transistors, electrons accumulated in floating gate electrodes are injected to pinning regions due to a tunneling current, whereby stored data is erased.

Needless to say, the above-mentioned value of an operating voltage is exemplary, and the present invention is not limited thereto. Actually, a voltage applied to the memory transistor (1,1) depends upon the thickness of a semiconductor active layer of a memory transistor, the capacity between the control gate electrode and the floating gate electrode, etc. The operating voltage of the memory transistor (1,1) is also varied in accordance therewith.

During write and read with respect to the memory transistor (1,1), when a voltage is applied to a memory cell in the same column or row, erroneous erasure or erroneous write may be conducted. It is required that an operating voltage is set so as to minimize write stress and read stress, and so as not to cause erroneous erasure and erroneous write.

The circuit configuration of this embodiment can be manufactured by using the process shown in Embodiment 1. The memory transistor with a split gate structure described in Embodiment 2 can also be used.

[Embodiment 6]

Figure 10A:
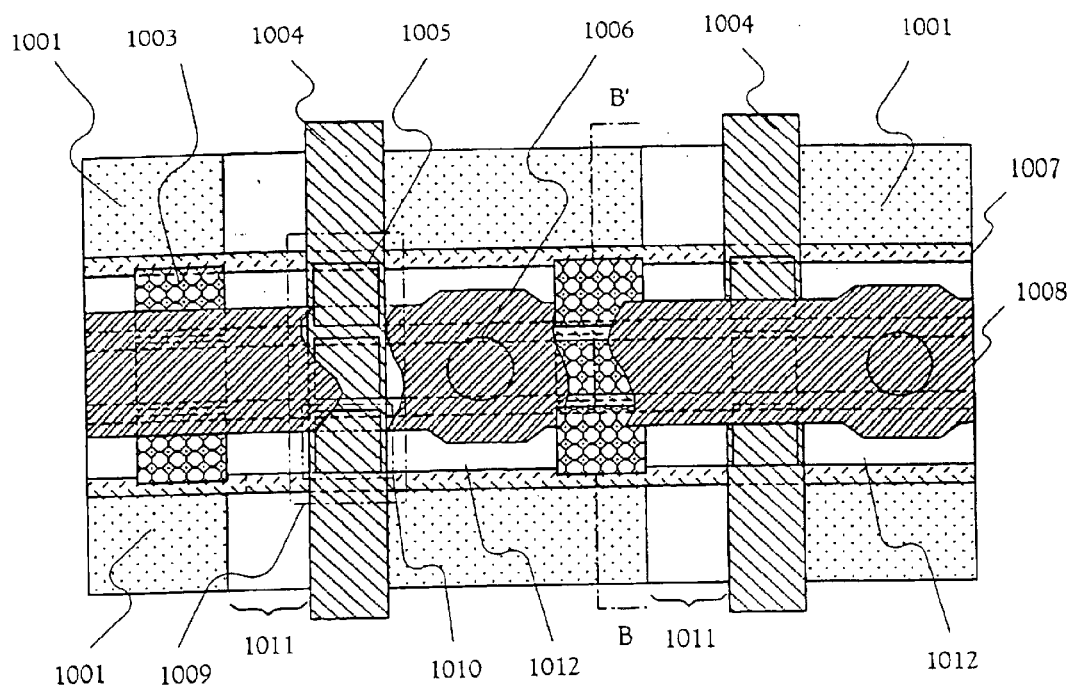
FIGS. 10A and 10B are a top view and a cross-sectional view of the nonvolatile memory of Embodiment 6.

In this embodiment, an upper surface configuration of a memory cell constituting a nonvolatile memory using pinning regions according to the present invention will be described. FIG. 10A shows an exemplary top view of a memory cell array constituting a NOR-type flash memory described in the embodiment mode.

The top view in FIG. 10A includes two pinning memory transistors arranged in parallel in the NOR-type flash memory described in Embodiment 5. Reference numerals 1001 and 1007 denote a field oxide film and a pinning region, respectively. In FIG. 10A, each pinning memory transistor 1009 includes three floating gate electrodes 1005, and is composed of three sub-memory transistors 1010. Reference numerals 1011 and 1012 denote a source region and a drain region, and the drain region 1012 and a line (bit line) 1008 are electrically connected to each other via a contact hole 1006. Furthermore, a control gate electrode of the memory transistor 1009 also functions as a word line 1004.

Figure 10B:
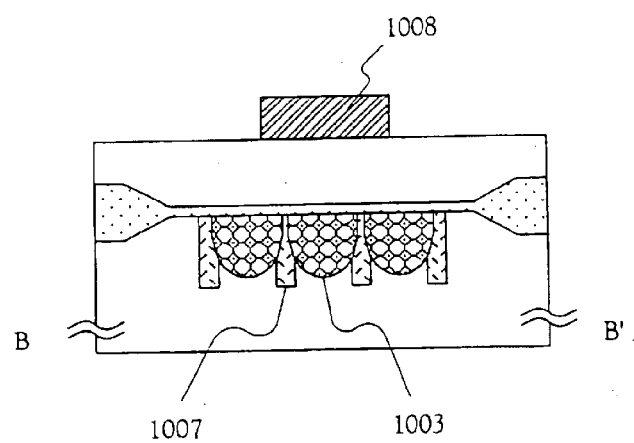

In FIG. 10A, in order to be matched with the circuit configuration in Embodiment 5, it is required that pinning regions are electrically connected between two memory transistors, and the source/drain regions are in an electrically non-connected state. In order to obtain such a configuration, a substantially intrinsic region is formed without adding impurities to a region 1003. More preferably, by adding impurities such as oxygen, an impurity region may be formed, which is non-conductive with respect to both the electrons and the holes. In particular, FIG. 10B shows a cross-sectional view taken along a line B–B' in the case where oxygen is added. In FIG. 10B, reference numerals 1007 and 1003 denote a pinning region and an impurity region with oxygen added thereto.

In FIG. 10A, an exemplary upper surface of a memory cell in the embodiment is illustrated. Needless to say, any upper surface may be used as long as it is matched with the circuit configuration described in Embodiment 5.

[Embodiment 7]

In this embodiment, a microprocessor such as an RISC processor and an ASIC processor will be described in which nonvolatile memories of the present invention are integrated on one chip.

Figure 11:
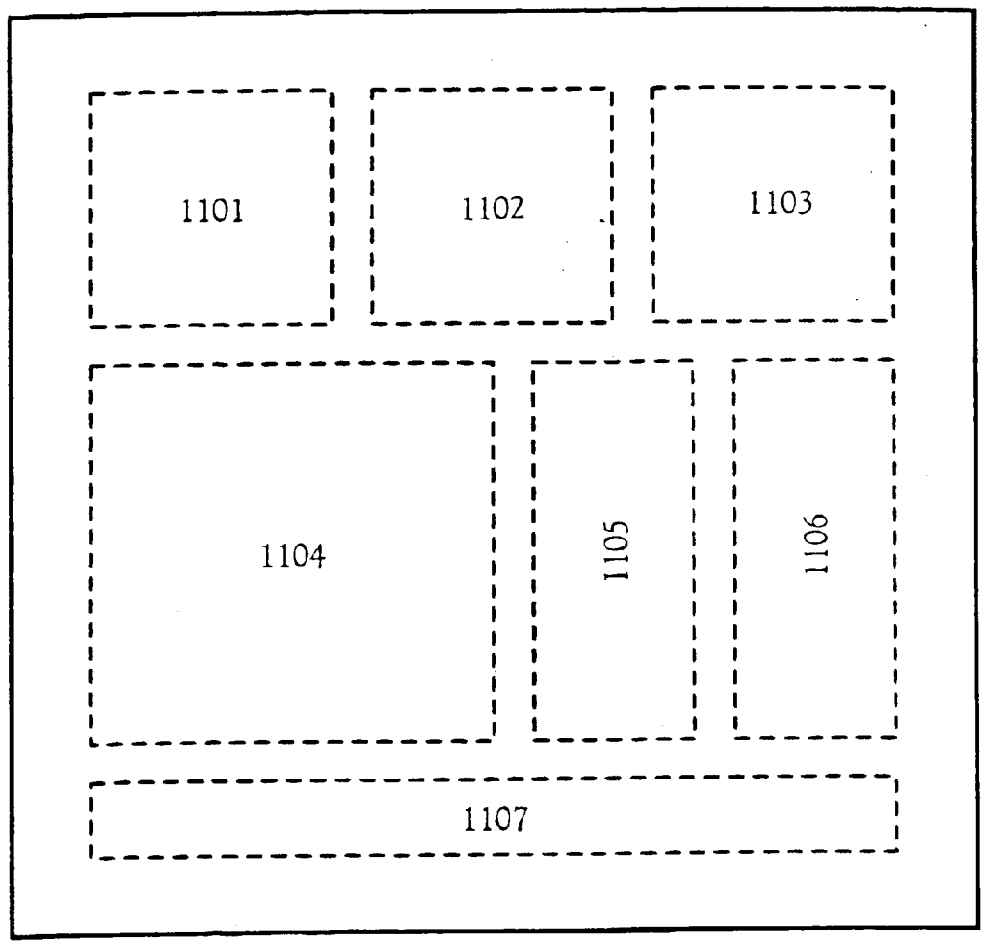
FIG. 11 is a view showing a semiconductor circuit using the nonvolatile memory of Embodiment 7.

FIG. 11 shows an exemplary microprocessor. The microprocessor is typically composed of a CPU core 1101, a cache memory 1102 (which may be a RAM), a clock controller 1103, a flash memory 1104, a cache controller 1105, a serial interface 1106, an I/O port 1107, and the like.

Needless to say, the microprocessor shown in FIG. 11 is a simplified example, and an actual microprocessor is various designed depending upon its use.

In the microprocessor shown in FIG. 11, the CPU core 1101, the clock controller 1103, the cache controller 1105, the serial interface 1106, and the I/O port 1107 are composed of a CMOS circuit.

As the flash memory 1104, the nonvolatile memory of the present invention is used, and a multi-valued flash memory utilizing a pinning memory transistor is used. As the circuit configuration of the flash memory 1104, that shown in Embodiment 3 or 5 may be used, or the other circuit configurations may be used. It is also possible to utilize the nonvolatile memory of the present invention for the cache memory 1102.

It is also effective to provide pinning regions used in the present invention with respect to the CMOS circuit that forms the CPU core 1101, the clock controller 1103, the cache controller 1105, the serial interface 1106, and the I/O port 1107. Regarding the case where pinning regions are applied to a transistor including a CMOS circuit, for example, Japanese Patent Application Laid-open No. Hei 10-65162 can be referred to.

As described above, it is possible to provide pinning regions at required positions in the course of circuit designing. Those skilled in the art may appropriately determine whether the pinning regions are used in the entire circuit or in a part thereof. In the case where the present invention is applied to a hybrid IC in which various performances are complexed, a degree of freedom of such circuit designing is very effective.

[Embodiment 8]

The nonvolatile memory of the present invention can be incorporated into electronic equipment in various fields, as a recording medium for storing/reading data. In this embodiment, such electronic equipment will be described.

Examples of the electronic equipment that can utilize the nonvolatile memory of the present invention include a video camera, a digital camera, a (rear-type or front-type) projector, a head mount display, a goggle-type display, a game machine, a car navigator, a personal computer, a portable information terminal (a mobile computer, a mobile phone, an electronic dictionary, etc.), and the like. FIGS. 12A–12F and 13A–13B illustrate examples thereof.

Figure 12A:
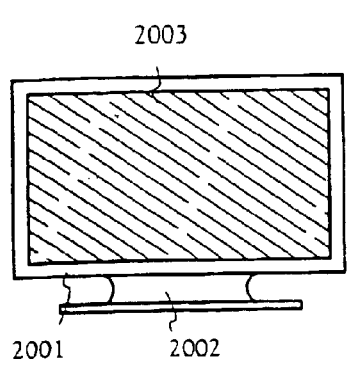
FIGS. 12A to 12F show electronic apparatus using the nonvolatile memory of Embodiment 8.

FIG. 12A shows a display that includes a housing 2001, a supporter 2002, a display portion 2003, and the like. The present invention is connected to the display portion 2003 and other signal control circuits, and used for correcting an image signal and storing processing data.

Figure 12B:
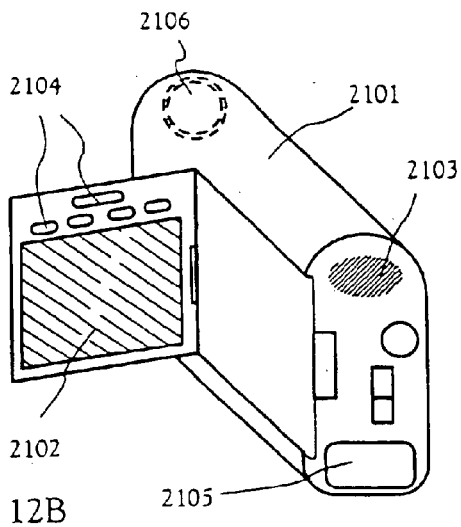

FIG. 12B shows a video camera that is composed of a body 2101, a display portion 2102, a voice input portion 2103, an operation switch 2104, a battery 2105, and an image-receiving portion 2106. The present invention is incorporated into a built-in LSI substrate and used for storing image data and the like.

Figure 12C:
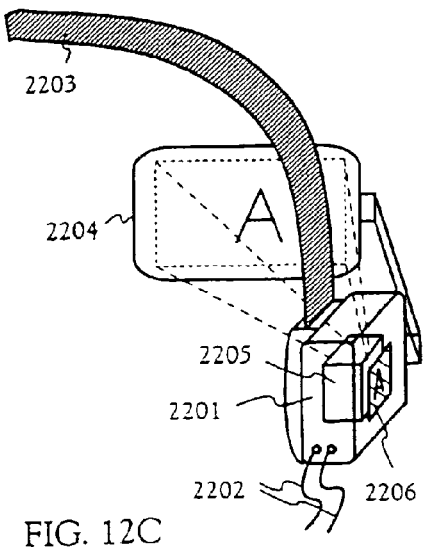

FIG. 12C shows a part (right chip side) of a head mount display including a body 2201, a signal cable 2202, a head portion fixing band 2203, a display portion 2204, an optical system 2205, a display apparatus 2206, and the like. The present invention is connected to the display apparatus 2206 and other signal control circuits, and used for correcting an image signal and storing processing data.

Figure 12D:
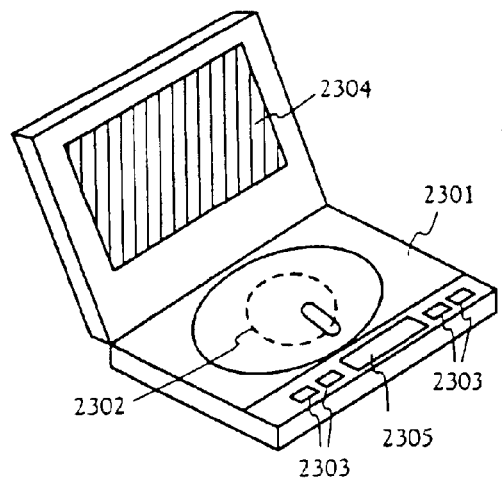

FIG. 12D shows an image reproducing apparatus (more specifically, a DVD reproducing apparatus) provided with a recording medium, which is composed of a body 2301, a recording medium 2302, an operation switch 2303, a display portion (a) 2304, a display portion (b) 2305, and the like. This apparatus uses as a recording medium a digital versatile disc (DVD), a compact disc (CD), and the like so as to allow a user to listen to music, see movies, play games, and browse the Internet. The present invention is incorporated into a built-in LSI substrate and used for storing image data and processing data.

Figure 12E:
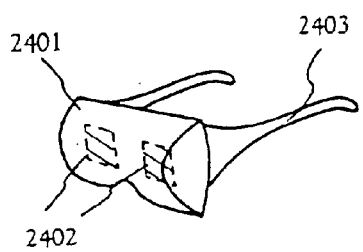

FIG. 12E shows a goggle type display that includes a body 2401, a display portion 2402, and an arm portion 2403. The present invention is connected to the display portion 2402 and other signal control circuits, and used for correcting an image signal and storing processing data.

Figure 12F:
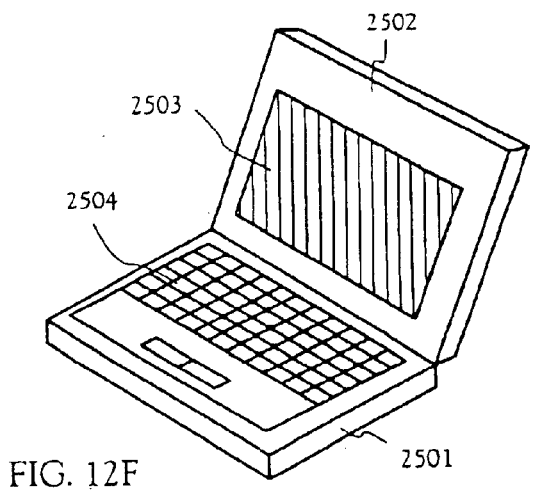

FIG. 12F shows a personal computer that is composed of a body 2501, a housing 2502, a display portion 2503, a keyboard 2504, and the like. The present invention is incorporated into a built-in LSI substrate, and used for storing processing data and image data.

Figure 13A:
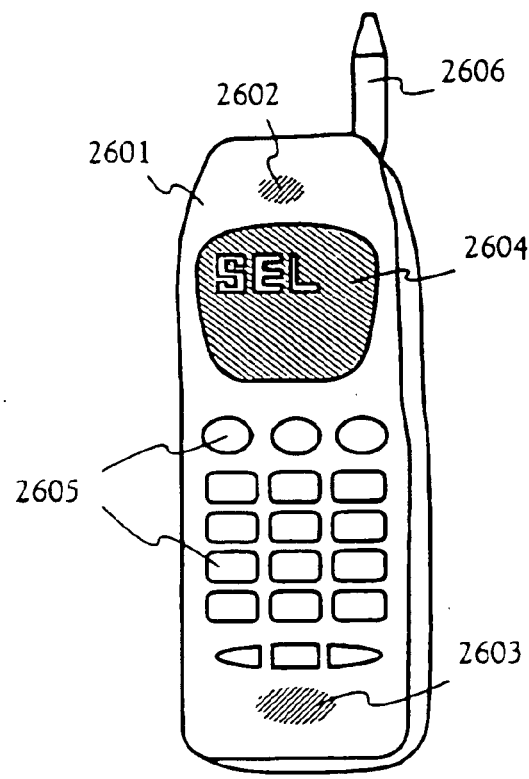
FIGS. 13A and 13B show electronic apparatus using the nonvolatile memory of Embodiment 8.

FIG. 13A shows a mobile phone that includes a body 2601, a voice output portion 2602, a voice input portion 2603, a display portion 2604, an operation switch 2605, and an antenna 2606. The present invention is incorporated into a built-in LSI substrate, and used for adding an address function of recording telephone numbers.

Figure 13B:
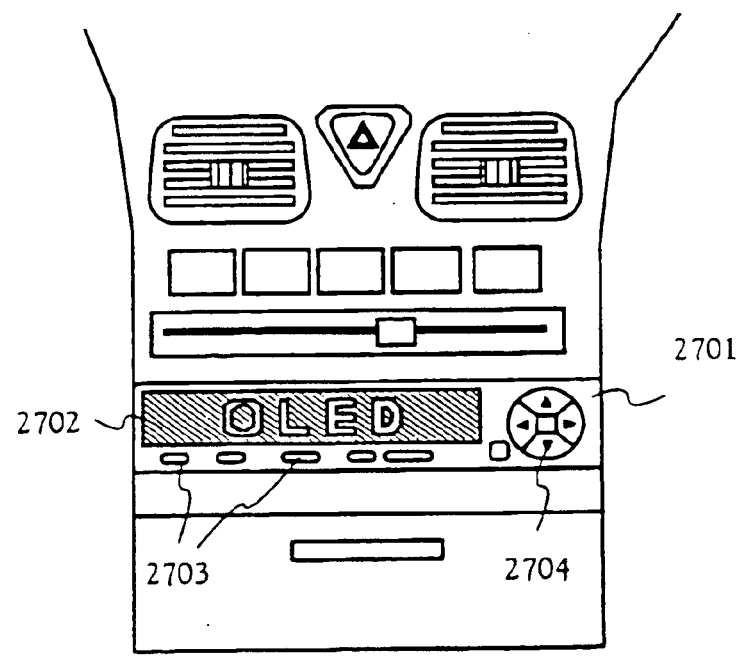

FIG. 13B shows an acoustic reproducing apparatus (more specifically, a car audio system) which includes a body 2701, a display portion 2702, and operation switches 2703 and 2704. The present invention is incorporated into a built-in LSI substrate, and used for storing image data and processing data. Furthermore, in this embodiment, an in-car audio system is illustrated. However, a portable or domestic acoustic reproducing apparatus may be used.

As described above, the application range of the present invention is very wide, so that the present invention is applicable to electronic equipment in various fields. Furthermore, the electronic equipment of this embodiment can also be realized even by using the configuration formed of any combination of Embodiments 1 to 6.

According to the present invention, the fine processing effect such as a short channel effect is minimized, and a nonvolatile memory can be further miniaturized.

Furthermore, according to the present invention, a cell is allowed to have multi values by a method completely different from a multi-valued technique according to the conventional method of controlling a charge accumulation amount of a floating gate electrode, and a cell is allowed to have more values compared with the prior art.

Consequently, a nonvolatile memory with a very high integration density can be realized.

Furthermore, by mounting a nonvolatile memory with a very high integration density, a multi-functional semiconductor device with a high function can be provided.

What is claimed is:

1. A semiconductor device comprising:
   a CPU core; and
   a flash memory comprising at least one memory transistor, said memory transistor comprising:
   a source region, a drain region and an active region formed in a semiconductor,
   said active region comprising:
      a plurality of impurity regions provided in a stripe shape in a channel length direction,
      a plurality of intrinsic or substantially intrinsic channel forming regions interposed between the plurality of impurity regions, and
      wherein the memory transistor stores multi-valued data.

2. A semiconductor device comprising:
   a CPU core; and
   a flash memory comprising at least one memory transistor, said memory transistor comprising:
   a source region, a drain region and an active region formed in a semiconductor;
   a first gate insulating film over the active region;
   a plurality of floating gate electrodes;
   a second gate insulating film;
   a control gate electrode,
   said active region comprising:
      a plurality of impurity regions provided in a stripe shape in a channel length direction,
      a plurality of intrinsic or substantially intrinsic channel forming regions interposed between the plurality of impurity regions,
      wherein each of the plurality of floating gate electrodes is provided over each of the plurality of channel forming regions via the first gate insulating film,
      wherein the control gate electrode is overlapped with the plurality of floating gate electrodes via the second gate insulating film,
      wherein the memory transistor stores multi-valued data.

3. A semiconductor device comprising:
   a CPU core; and
   a flash memory comprising at least one memory transistor, said memory transistor comprising:
   a source region, a drain region and an active region formed in a semiconductor;
   a first gate insulating film over the active region;
   a plurality of floating gate electrodes;
   a second gate insulating film;
   a control gate electrode,
   said active region comprising:
      a plurality of impurity regions provided in a stripe shape in a channel length direction,
      a plurality of intrinsic or substantially intrinsic channel forming regions interposed between the plurality of impurity regions,
      wherein each of the plurality of floating gate electrodes is provided over each of the plurality of channel forming regions via the first gate insulating film,
      wherein the control gate electrode is overlapped with the plurality of floating gate electrodes via the second gate insulating film,
      wherein an electric potential of each of the plurality of impurity regions is independently controlled,
      wherein the memory transistor stores multi-valued data.

4. A semiconductor device according to claim 2, wherein each of the plurality of floating gate electrodes is partially overlapped with one of the plurality of impurity regions via the first gate insulating film.

5. A semiconductor device according to claim 1, wherein the plurality of impurity regions provided in the active region are formed continuously in at least one of the source region and the drain region.

6. A semiconductor device according to claim 1, wherein each of the plurality of impurity regions comprises an element selected from Group 13 or Group 15 of the Periodic Table.

7. A semiconductor device according to claim 1, wherein each of the plurality of impurity regions comprises an element selected from Group 13 or Group 15 of the Periodic Table, wherein each of the plurality of impurity regions suppresses a depletion layer spreading from the drain region to the source region.

8. A semiconductor device according to claim 1, wherein each of the plurality of impurity regions comprises an element at a concentration in a range of $1 \times 10^{17}$ to $5 \times 10^{20}$ atoms/cm$^3$.

9. A semiconductor device according to claim 1, wherein a channel length of the memory transistor is in a range of 0.01 to 1 µm.

10. A semiconductor device according to claim 1, wherein a width of each of the plurality of impurity regions is in a range of 0.01 to 1 µm.

11. A semiconductor device according to claim 1, wherein a width of each of the plurality of channel forming regions is in a range of 0.01 to 1 µm.

12. A semiconductor device according to claim 1 wherein said semiconductor device is a microprocessor.

13. A semiconductor device according to claim 2, wherein the plurality of impurity regions provided in the active region are formed continuously in at least one of the source region and the drain region.

14. A semiconductor device according to claim 2, wherein each of the plurality of impurity regions comprises an element selected from Group 13 or Group 15 of the Periodic Table.

15. A semiconductor device according to claim 2, wherein each of the plurality of impurity regions comprises an element selected from Group 13 or Group 15 of the Periodic Table, wherein each of the plurality of impurity regions suppresses a depletion layer spreading from the drain region to the source region.

16. A semiconductor device according to claim 2,
wherein each of the plurality of impurity regions comprises an element at a concentration in a range of $1\times10^{17}$ to $5\times10^{20}$ atoms/cm$^3$.

17. A semiconductor device according to claim 2,
wherein a channel length of the memory transistor is in a range of 0.01 to 1 μm.

18. A semiconductor device according to claim 2,
wherein a width of each of the plurality of impurity regions is in a range of 0.01 to 1 μm.

19. A semiconductor device according to claim 2,
wherein a width of each of the plurality of channel forming regions is in a range of 0.01 to 1 μm.

20. A semiconductor device according to claim 2 wherein said semiconductor device is a microprocessor.

21. A semiconductor device memory according to claim 3,
wherein each of the plurality of floating gate electrodes is partially overlapped with one of the plurality of impurity regions via the first gate insulating film.

22. A semiconductor device according to claim 3,
wherein the plurality of impurity regions provided in the active region are formed continuously in at least one of the source region and the drain region.

23. A semiconductor device according to claim 3,
wherein each of the plurality of impurity regions comprises an element selected from Group 13 or Group 15 of the Periodic Table.

24. A semiconductor device according to claim 3,
wherein each of the plurality of impurity regions comprises an element selected from Group 13 or Group 15 of the Periodic Table,
wherein each of the plurality of impurity regions suppresses a depletion layer spreading from the drain region to the source region.

25. A semiconductor device according to claim 3,
wherein each of the plurality of impurity regions comprises an element at a concentration in a range of $1\times10^{17}$ to $5\times10^{20}$ atoms/cm$^3$.

26. A semiconductor device according to claim 3,
wherein a channel length of the memory transistor is in a range of 0.01 to 1 μm.

27. A semiconductor device according to claim 3,
wherein a width of each of the plurality of impurity regions is in a range of 0.01 to 1 μm.

28. A semiconductor device according to claim 3,
wherein a width of each of the plurality of channel forming regions is in a range of 0.01 to 1 μm.

29. A semiconductor device according to claim 3 wherein said semiconductor device is a microprocessor.

30. A mobile phone comprising:
a display; and
at least one memory transistor, said memory transistor comprising:
  a source region, a drain region and an active region formed in a semiconductor,
  said active region comprising:
    a plurality of impurity regions provided in a stripe shape in a channel length direction,
    a plurality of intrinsic or substantially intrinsic channel forming regions interposed between the plurality of impurity regions, and
  wherein the memory transistor stores multi-valued data.

31. A mobile phone comprising:
a display; and
at least one memory transistor, said memory transistor comprising:
  a source region, a drain region and an active region formed in a semiconductor;
  a first gate insulating film over the active region;
  a plurality of floating gate electrodes;
  a second gate insulating film;
  a control gate electrode,
  said active region comprising:
    a plurality of impurity regions provided in a stripe shape in a channel length direction,
    a plurality of intrinsic or substantially intrinsic channel forming regions interposed between the plurality of impurity regions,
  wherein each of the plurality of floating gate electrodes is provided over each of the plurality of channel forming regions via the first gate insulating film,
  wherein the control gate electrode is overlapped with the plurality of floating gate electrodes via the second gate insulating film,
  wherein the memory transistor stores multi-valued data.

32. A mobile phone comprising:
a display; and
at least one memory transistor, said memory transistor comprising:
  a source region, a drain region and an active region formed in a semiconductor;
  a first gate insulating film over the active region;
  a plurality of floating gate electrodes;
  a second gate insulating film;
  a control gate electrode,
  said active region comprising:
    a plurality of impurity regions provided in a stripe shape in a channel length direction,
    a plurality of intrinsic or substantially intrinsic channel forming regions interposed between the plurality of impurity regions,
  wherein each of the plurality of floating gate electrodes is provided over each of the plurality of channel forming regions via the first gate insulating film,
  wherein the control gate electrode is overlapped with the plurality of floating gate electrodes via the second gate insulating film,
  wherein an electric potential of each of the plurality of impurity regions is independently controlled,
  wherein the memory transistor stores multi-valued data.

33. A mobile phone according to claim 32,
wherein each of the plurality of floating gate electrodes is partially overlapped with one of the plurality of impurity regions via the first gate insulating film.

* * * * *